United States Patent
Hashimoto et al.

(10) Patent No.: US 9,704,703 B2
(45) Date of Patent: Jul. 11, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Yoshiro Hirose, Toyama (JP); Atsushi Sano, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 15 days.

(21) Appl. No.: 14/187,733

(22) Filed: Feb. 24, 2014

(65) Prior Publication Data
US 2014/0242809 A1 Aug. 28, 2014

(30) Foreign Application Priority Data

Feb. 26, 2013 (JP) ................................. 2013-036278

(51) Int. Cl.
*H01L 21/31* (2006.01)
*H01L 21/469* (2006.01)
(Continued)

(52) U.S. Cl.
CPC ........ *H01L 21/02126* (2013.01); *C23C 16/30* (2013.01); *C23C 16/36* (2013.01);
(Continued)

(58) Field of Classification Search
CPC ... C23C 16/36; C23C 16/45531; C23C 16/30; H01L 21/02167; H01L 21/02126;
(Continued)

(56) References Cited

U.S. PATENT DOCUMENTS

2007/0020923 A1* 1/2007 Kraus ..................... C23C 16/34
 438/644
2008/0213479 A1 9/2008 Chou et al.
(Continued)

FOREIGN PATENT DOCUMENTS

JP 2008-227460 A 9/2008
JP 2011-238894 A 11/2011
(Continued)

OTHER PUBLICATIONS

Taiwanese Office Action, TW Application No. 103102248, Jan. 21, 2016, 5 pages (English translation provided).
(Continued)

*Primary Examiner* — Charles Garber
*Assistant Examiner* — Abdulfattah Mustapha
(74) *Attorney, Agent, or Firm* — Volpe and Koenig, P.C.

(57) ABSTRACT

A method of manufacturing a semiconductor device is disclosed. The method includes forming a film containing a predetermined element and carbon on a substrate by performing a cycle a predetermined number of times. The cycle includes supplying a first process gas containing the predetermined element and a halogen element to the substrate; supplying a second process gas containing carbon and nitrogen to the substrate; supplying a third process gas containing carbon to the substrate; and supplying a fourth process gas to the substrate, the fourth process gas being different from each of the first to the third process gases.

19 Claims, 14 Drawing Sheets

(51) Int. Cl.
*H01L 21/02* (2006.01)
*C23C 16/30* (2006.01)
*C23C 16/36* (2006.01)
*C23C 16/455* (2006.01)

(52) U.S. Cl.
CPC .... *C23C 16/45531* (2013.01); *H01L 21/0228* (2013.01); *H01L 21/02167* (2013.01); *H01L 21/02211* (2013.01)

(58) Field of Classification Search
CPC ........... H01L 21/0228; H01L 21/02211; H01L 21/02172; H01L 21/02
USPC ......... 438/584, 658–758; 257/437, 626, 632, 257/634, 646, E21.159, E23.025, 257/E23.077, E23.116, E23.126, E33.06, 257/E31.119; 427/255.391, 255.39, 427/255.394, 249.17, 249.19
See application file for complete search history.

(56) References Cited

U.S. PATENT DOCUMENTS

| | | | |
|---|---|---|---|
| 2009/0170345 A1* | 7/2009 | Akae | H01L 21/0214 438/786 |
| 2009/0215262 A1* | 8/2009 | Ramaswamy et al. | 438/653 |
| 2009/0305517 A1* | 12/2009 | Nakashima et al. | 438/786 |
| 2010/0210094 A1* | 8/2010 | Furusawa et al. | 438/493 |
| 2011/0256733 A1 | 10/2011 | Hirose et al. | |
| 2011/0318937 A1 | 12/2011 | Akae et al. | |
| 2012/0184110 A1* | 7/2012 | Hirose | C23C 16/30 438/763 |
| 2013/0052836 A1 | 2/2013 | Hirose et al. | |

FOREIGN PATENT DOCUMENTS

| | | |
|---|---|---|
| JP | 2012-015344 A | 1/2012 |
| JP | 2012-019194 A | 1/2012 |
| JP | 2012-160704 A | 8/2012 |
| TW | 2012-05674 A | 2/2012 |
| WO | 2011/125395 A1 | 10/2011 |

OTHER PUBLICATIONS

Japanese Notification of Reasons of Refusal, JP Patent Application No. 2013-036278, Aug. 2, 2016, 4 pages (english translation provided).

* cited by examiner

FIG. 6

| Thickness Map | Top | Center | Bottom |
|---|---|---|---|
| Thickness (Å) | 170.4 | 167.8 | 176.5 |
| WiW (±%) | 2.7 | 3.6 | 4.3 |
| WtW (±%) | 2.4 | | |
| R.I.(Ave) | 1.575 | | |

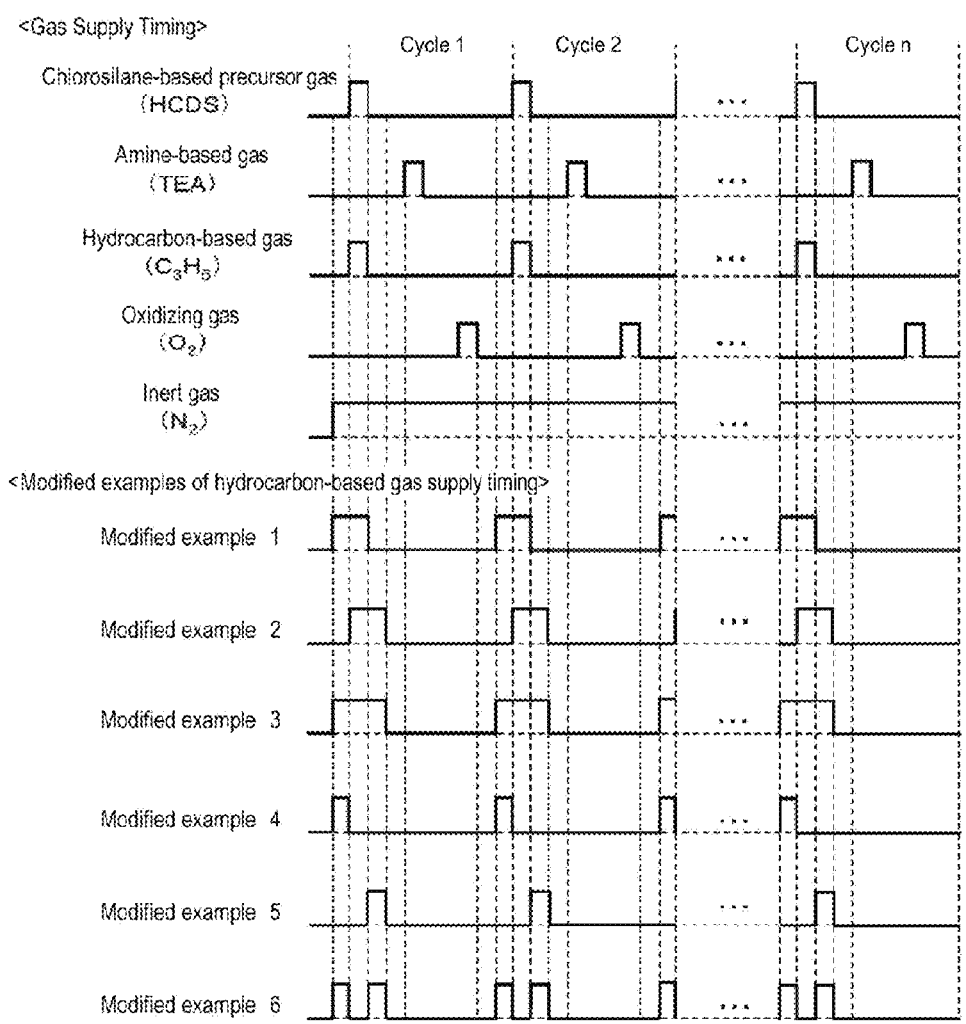

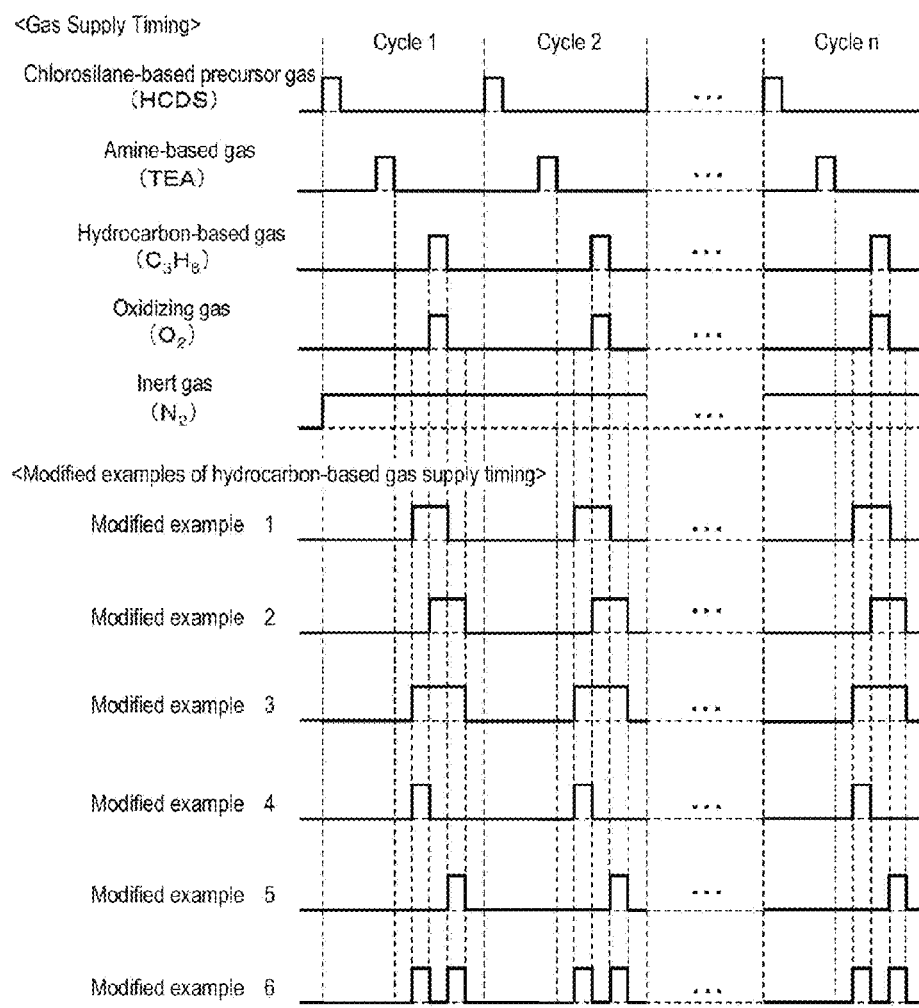

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-036278, filed on Feb. 26, 2013, the entire contents of which are incorporated herein by reference.

TECHNICAL FIELD

The present disclosure relates to a method of manufacturing a semiconductor device, a substrate processing apparatus, and a recording medium, which include performing a process of forming a thin film on a substrate, or operating a device to perform a process of forming a thin film on a substrate.

BACKGROUND

A process of forming a silicon-based insulating film such as a silicon oxide ($SiO_2$) film or a silicon nitride ($Si_3N_4$) film, in other words, an insulating film containing silicon as a predetermined element, on a substrate such as a silicon wafer or the like may be performed during manufacturing semiconductor devices. Silicon oxide films are widely used as an insulating film or an inter-layer film because of its high insulating property and low dielectric property. Silicon nitride films are also widely used as an insulating film, a mask film, a charge storing film, or a stress control film because of its high insulating property, high corrosion resistance, low dielectric property, and high film stress controllability. For the purpose of improving etching resistance, it is known to form a silicon oxycarbide (SiOC) film, a silicon carbonitride (SiCN) film, or a silicon oxycarbonitride (SiOCN) film by adding carbon (C) in the above silicon oxide film or silicon nitride film.

However, such addition of carbon into the insulating film may result in an increase in its dielectric constant and deterioration of its leak resistance while increasing its etching resistance. Thus, there are trade-off relationships between a low dielectric constant, a high etching resistance, and a high leak resistance. Although requirements for the above properties depend on use of the insulating films, there is a need to form an insulating film satisfying the requirements by increasing controllability of compositions in the insulating film.

SUMMARY

The present disclosure provides some embodiments of a method of manufacturing a semiconductor device, which is capable of increasing controllability of compositions in a film in order to provide the film with properties of a low dielectric constant, a high etching resistance, and a high leak resistance.

According to one embodiment of the present disclosure, there is provided a method of manufacturing a semiconductor device, the method including forming a film containing a predetermined element and carbon on a substrate by performing a cycle a predetermined number of times, the cycle including supplying a first process gas containing the predetermined element and a halogen element to the substrate; supplying a second process gas containing carbon and nitrogen to the substrate; supplying a third process gas containing carbon to the substrate; and supplying a fourth process gas to the substrate, the fourth process gas being different from each of the first to the third process gases According to another embodiment of the present disclosure, there is provided a substrate processing apparatus including a process chamber configured to accommodate a substrate; a first gas supply system configured to supply a first process gas containing a predetermined element and a halogen element into the process chamber; a second gas supply system configured to supply a second process gas containing carbon and nitrogen into the process chamber; a third gas supply system configured to supply a third process gas containing carbon into the process chamber; a fourth gas supply system configured to supply a fourth process gas into the process chamber, the fourth process gas being different from each of the first to the third process gases; and a control unit configured to control the first to the fourth gas supply systems to form a film containing the predetermined element and carbon on the substrate by performing a cycle a predetermined number of times, the cycle including supplying the first process gas to the substrate in the process chamber; supplying the second process gas to the substrate in the process chamber; supplying the third process gas to the substrate in the process chamber; and supplying the fourth process gas to the substrate in the process chamber.

According to another embodiment of the present disclosure, there is provided a non-transitory computer-readable recording medium storing a program that causes a computer to perform a process of forming a film containing a predetermined element and carbon on a substrate in a process chamber by performing a cycle a predetermined number of times, the cycle including supplying a first process gas containing the predetermined element and a halogen element to the substrate in the process chamber; supplying a second process gas containing carbon and nitrogen to the substrate in the process chamber; supplying a third process gas containing carbon to the substrate in the process chamber; and supplying a fourth process gas to the substrate in the process chamber, the fourth process gas being different from each of the first to the third process gases.

BRIEF DESCRIPTION OF THE DRAWINGS

FIG. 6 illustrates measurement results on film thickness uniformity in a wafer plane, film thickness uniformity between wafer planes, and so on of a SiOC film according to a first implementation example of the present disclosure.

FIG. 13 illustrates gas supply timings and modified examples in a film forming sequence according to another embodiment of the present disclosure.

FIG. 14 is illustrates gas supply timings and modified examples in a film forming sequence according to still another embodiment of the present disclosure.

DETAILED DESCRIPTION

First Embodiment

A first embodiment of the present disclosure is described below in detail with reference to the accompanying drawings.

(1) Configuration of Substrate Processing Apparatus

Figure 1:
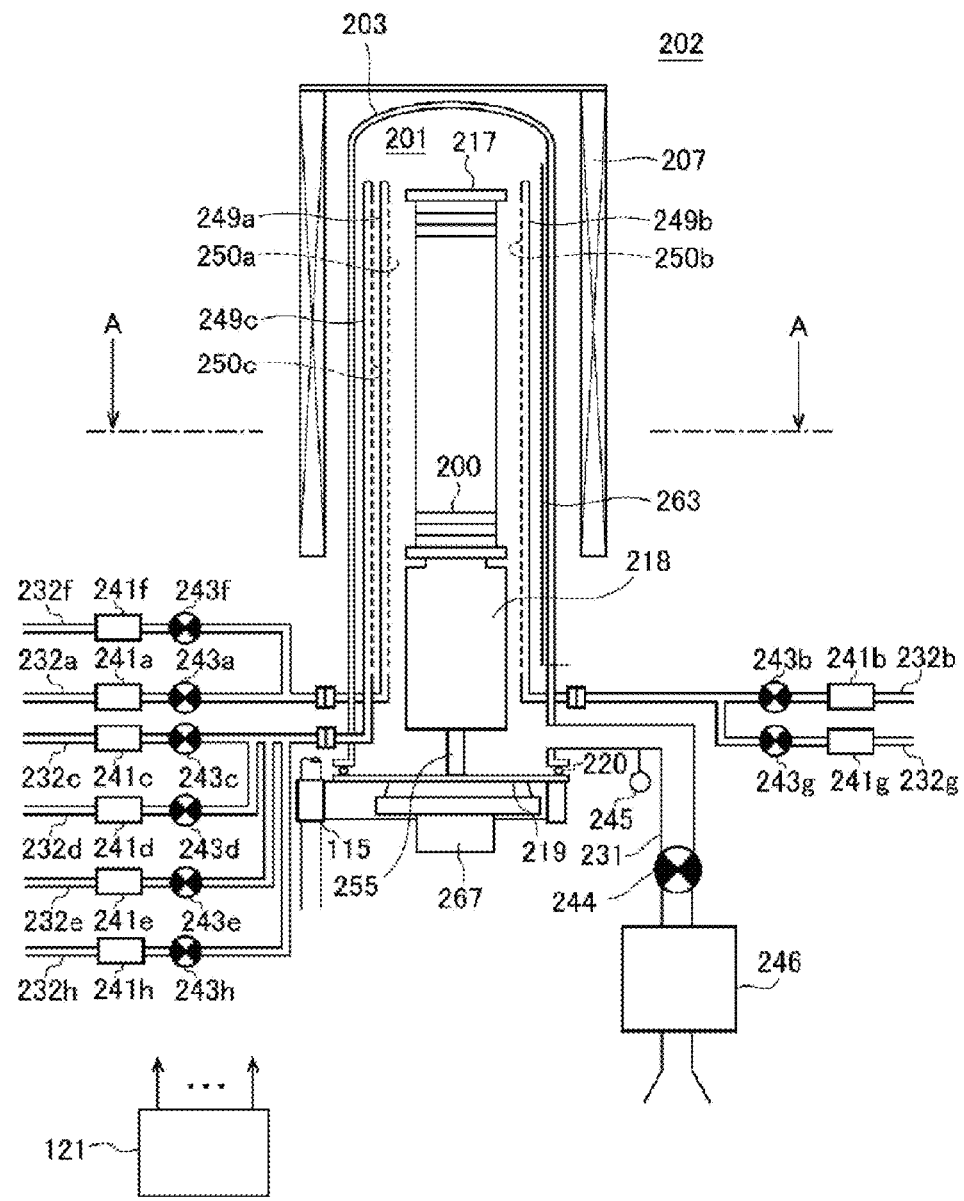
FIG. 1 schematically illustrates a configuration of a vertical processing furnace of a substrate processing apparatus appropriately employed in one embodiment of the present disclosure, in which a portion of the processing furnace is shown by a longitudinal sectional view.
Figure 2:
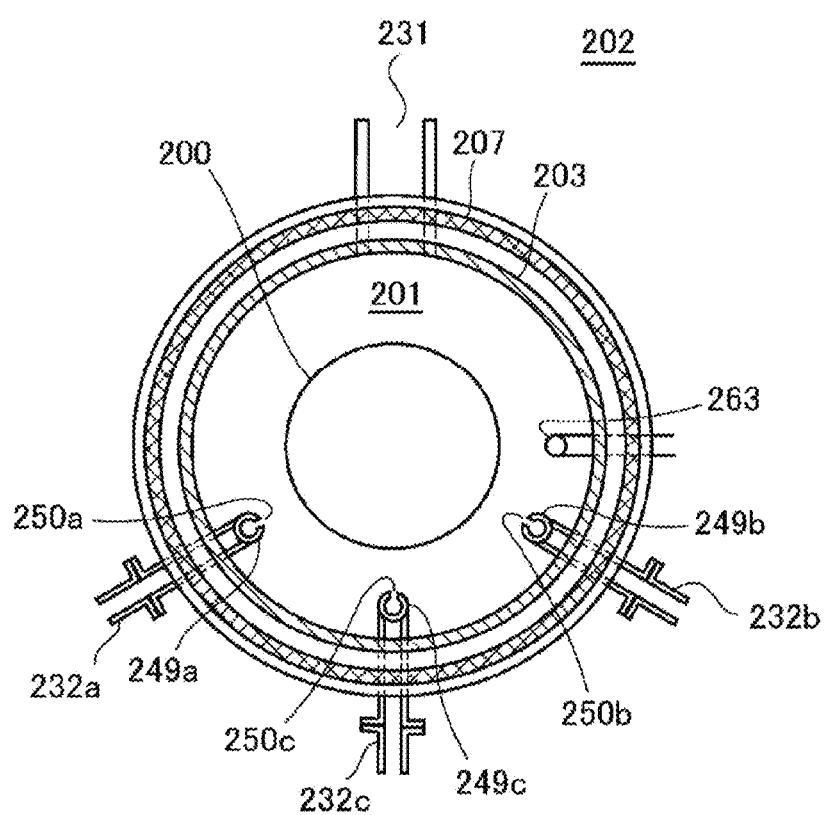
FIG. 2 schematically illustrates a configuration of the vertical processing furnace of the substrate processing apparatus appropriately employed in the embodiment of the present disclosure, in which a portion of the processing furnace is shown by a sectional view taken along a line A-A in FIG. 1.

FIG. 1 schematically illustrates a configuration of a vertical processing furnace 202 of a substrate processing apparatus appropriately employed in one embodiment of the present disclosure, in which a portion of the processing furnace 202 is shown by a longitudinal sectional view. FIG. 2 schematically illustrates a configuration of the vertical processing furnace 202 of the substrate processing apparatus appropriately employed in the embodiment of the present disclosure, in which a portion of the processing furnace 202 is shown by a sectional view taken along a line A-A in FIG. 1.

As illustrated in FIG. 1, the vertical processing furnace 202 has a heater 207 serving as a heating unit (i.e., heating mechanism). The heater 207 is of a cylindrical shape and is supported by a heater base (not shown) serving as a support plate and is vertically arranged. The heater 207 acts as an activation unit to activate gas by heat, which will be described later.

A reaction tube 203 constituting a reaction vessel (i.e., process vessel) is installed inside the heater 207 to be concentric with the heater 207. The reaction tube 203 is made of a heat resistant material such as quartz (i.e., $SiO_2$) and silicon carbide (SiC) and has a cylindrical shape with its upper end closed and its lower end opened. A process chamber 201 is formed in a hollow cylindrical portion of the reaction tube 203. The process chamber 201 is configured to accommodate a plurality of wafers 200 as substrates in such a state that the wafers 200 are horizontally stacked in multiple stages along a vertical direction by a boat 217 which will be described later.

A first nozzle 249a, a second nozzle 249b, and a third nozzle 249c penetrate through a lower portion of the reaction tube 203 to be installed in the process chamber 201. The first nozzle 249a, the second nozzle 249b, and the third nozzle 249c are connected to a first gas supply pipe 232a, a second gas supply pipe 232b, and a third gas supply pipe 232c, respectively. A fourth gas supply pipe 232d and a fifth gas supply pipe 232e are connected to the third gas supply pipe 232c. In this manner, the three nozzles 249a to 249c and the five gas supply pipes 232a to 232e are provided to the reaction tube 203 to supply plural types of gases, in this example, five kinds of gases into the process chamber 201.

An exhaust pipe 231 is installed at a lower portion of the reaction tube 203. In addition, a metal manifold (not shown) that supports the reaction tube 203 may be installed under the reaction tube 203 such that the nozzles 249a, 249b, and 249c are configured to penetrate through a sidewall of the metal manifold. In this case, the exhaust pipe 231 may be installed to the metal manifold, rather than the lower portion of the reaction tube 203. In this manner as described above, a furnace port of the processing furnace 202 may be formed of metal, and the nozzles 249a, 249b, and 249c may be installed in the metal furnace port.

A mass flow controller (MFC) 241a serving as a flow rate controller (i.e., a flow rate control part) and a valve 243a serving as an opening/closing valve are sequentially installed in the first gas supply pipe 232a from an upstream side. A first inert gas supply pipe 232f is connected to the first gas supply pipe 232a at a more downstream side of the valve 243a. A mass flow controller (MFC) 241f serving as a flow rate controller (i.e., a flow rate control unit) and a valve 243f serving as an opening/closing valve are sequentially installed in the first inert gas supply pipe 232f from an upstream side. In addition, the above-described first nozzle 249a is connected to an end of the first gas supply pipe 232a. The first nozzle 249a is installed in an arc-shaped space between an inner wall of the reaction tube 203 and the wafers 200 such that the first nozzle 249a extends upward in a stacked direction of the wafers 200 from a lower portion of the inner wall of the reaction tube 203 to an upper portion thereof. Specifically, the first nozzle 249a is installed along a wafer arrangement region where the wafers 200 are arranged, and in a region that horizontally surrounds the wafer arrangement region at a side of the wafer arrangement region. The first nozzle 249a is configured as an L-shaped nozzle, and its horizontal portion is installed to penetrate through a lower sidewall of the reaction tube 203 while its vertical portion is installed to ascend at least from one end portion to the other end portion of the wafer arrangement region. A gas supply hole 250a for supplying gas is installed at a side surface of the first nozzle 249a. The gas supply hole 250a is opened toward a center of the reaction tube 203 to allow the gas to be supplied to the wafers 200. A plurality of gas supply holes 250a is installed at a predetermined opening pitch from a lower portion to an upper portion of the reaction tube 203. Each of the gas supply holes 250a may have the same opening area.

A first gas supply system mainly includes the first gas supply pipe 232a, the MFC 241a, and the valve 243a. The first gas supply system may also include the first nozzle 249a. In addition, a first inert gas supply system mainly includes the first inert gas supply pipe 232f, the MFC 241f, and the valve 243f. The first inert gas supply system may also serve as a purge gas supply system.

A mass flow controller (MFC) 241b serving as a flow rate controller (i.e., a flow rate control part) and a valve 243b serving as an opening/closing valve are sequentially installed in the second gas supply pipe 232b from an upstream side. In addition, a second inert gas supply pipe 232g is connected to the second gas supply pipe 232b at a more downstream side of the valve 243b. A mass flow controller (MFC) 241g serving as a flow rate controller (i.e., a flow rate control unit) and a valve 243g serving as an opening/closing valve are sequentially installed in the second inert gas supply pipe 232g from an upstream side. In addition, the above-described second nozzle 249b is connected to an end of the second gas supply pipe 232b. The second nozzle 249b is installed in an arc-shaped space between the inner wall of the reaction tube 203 and the wafers 200 such that the second nozzle 249b extends upward in the stacked direction of the wafers 200 from a lower portion of the inner wall of the reaction tube 203 to an upper portion thereof. Specifically, the second nozzle 249b is installed along the wafer arrangement region where the wafers 200 are arranged, and in a region that horizontally surrounds the wafer arrangement region at a side of the wafer arrangement region. The second nozzle 249b is configured as an L-shaped nozzle, and its horizontal portion is installed to penetrate through a lower sidewall of the reaction tube 203 while its vertical portion is installed to ascend at least from one end portion to the other end portion of the wafer arrangement region. A gas supply hole 250b for supplying gas is installed at a side surface of the second nozzle 249b. The gas supply hole 250b is opened toward the center of the reaction tube 203 to allow the gas to be supplied to the wafers 200. A plurality of gas supply holes 250b is installed at a predetermined opening pitch from a lower portion to an upper portion of the reaction tube 203. Each of the gas supply holes 250b may have the same opening area.

A second gas supply system mainly includes the second gas supply pipe 232b, the MFC 241b, and the valve 243b. The second gas supply system may also include the second nozzle 249b. In addition, a second inert gas supply system mainly includes the second inert gas supply pipe 232g, the MFC 241g, and the valve 243g. The second inert gas supply system may also act as a purge gas supply system.

A mass flow controller (MFC) 241c serving as a flow rate controller (i.e., a flow rate control unit) and a valve 243c serving as an opening/closing valve are sequentially installed in the third gas supply pipe 232c from an upstream side. In addition, the fourth gas supply pipe 232d and the fifth gas supply pipe 232e are connected to the third gas supply pipe 232c at a more downstream side of the valve 243c. A mass flow controller (MFC) 241d serving as a flow rate controller (i.e., a flow rate control unit) and a valve 243d serving as an opening/closing valve are sequentially installed in the fourth gas supply pipe 232d from an upstream side. In addition, a mass flow controller (MFC) 241e serving as a flow rate controller (i.e., a flow rate control unit) and a valve 243e serving as an opening/closing valve are sequentially installed in the fifth gas supply pipe 232e from an upstream side. Further, a third inert gas supply pipe 232h is connected to the third gas supply pipe 232c at a more downstream side of connection portions in the third supply pipe 232c with the fourth gas supply pipe 232d and the fifth gas supply pipe 232e. A mass flow controller (MFC) 241h serving as a flow rate controller (i.e., a flow rate control unit) and a valve 243h serving as an opening/closing valve are sequentially installed in the third inert gas supply pipe 232h from an upstream side. In addition, the above-described third nozzle 249c is connected to an end of the third gas supply pipe 232c. The third nozzle 249c is installed in an arc-shaped space between the inner wall of the reaction tube 203 and the wafers 200 such that the third nozzle 249c extends upward in the stacked direction of the wafers 200 from a lower portion of the inner wall of the reaction tube 203 to an upper portion thereof. Specifically, the third nozzle 249c is installed along the wafer arrangement region where the wafers 200 are arranged, and in a region that horizontally surrounds the wafer arrangement region at a side of the wafer arrangement region. The third nozzle 249c is configured as an L-shaped nozzle, and its horizontal portion is installed to penetrate through a lower sidewall of the reaction tube 203 while its vertical portion is installed to ascend at least from one end portion to the other end portion of the wafer arrangement region. A gas supply hole 250c for supplying gas is installed at a side surface of the third nozzle 249c. The gas supply hole 250c is opened toward the center of the reaction tube 203 to allow the gas to be supplied to the wafers 200. A plurality of gas supply holes 250c is installed at a predetermined opening pitch from a lower portion to an upper portion of the reaction tube 203. Each of the gas supply holes 250c may have the same opening area.

A third gas supply system mainly includes the third gas supply pipe 232c, the MFC 241c, and the valve 243c. The third gas supply system may also include the third nozzle 249c. A fourth gas supply system mainly includes the fourth and the fifth gas supply pipes 232d and 232e, the MFCs 241d and 242e and the valves 243d and 243e. In addition, the fourth gas supply system may also include a portion of the third nozzle 249c at a more downstream side of the connection portion of the third gas supply pipe 232c with the fourth gas supply pipe 232d. In addition, a third inert gas supply system mainly includes the third inert gas supply pipe 232h, the MFC 241h, and the valve 243h. The third inert gas supply system may also act as a purge gas supply system.

As described above, the gas supply method according to the present embodiment transfers gases via the nozzles 249a, 249b, and 249c, which are arranged within the arc-shaped longitudinal space defined by the inner wall of the reaction tube 203 and end portions of the stacked wafers 200, and first supplies the gases from the gas supply holes 250a, 250b, and 250c (which are opened in the nozzles 249a, 249b, and 249c, respectively) into the reaction tube 203, near the wafers 200. Accordingly, the gases supplied into the reaction tube 203 mainly flow within the reaction tube 203 in a direction parallel to surfaces of the wafers 200, i.e., in a horizontal direction. According to the above configuration, the gases can be uniformly supplied to the wafers 200, thereby making a thickness of a thin film formed on each of the wafers 200 uniform. In addition, the gases flowing on the surfaces of the wafers 20 after reaction, i.e., residual gases, flow toward an exhaust port, i.e., the exhaust pipe 231, which will described later. However, the flow direction of the residual gases may be appropriately decided depending on a position of the exhaust port, and is not limited to a vertical direction.

A first process gas containing a predetermined element and a halogen element, for example, a chlorosilane-based precursor gas containing at least silicon (Si) and chlorine (Cl), is supplied from the first gas supply pipe 232a into the process chamber 201 through the MFC 241a, the valve 243a, and the first nozzle 249a. As used herein, the chlorosilane-based precursor gas refers to a chlorosilane-based precursor in a gaseous state, for example, a gas which is obtained by vaporizing a chlorosilane-based precursor in a liquid state under normal temperature (e.g., room temperature) and pressure, a chlorosilane-based precursor gas which is in a gaseous state under normal temperature and pressure, and the like. In addition, the chlorosilane-based precursor refers to a silane-based precursor having a chloro group as a halogen group and also refers to a precursor containing at least silicon (Si) and chlorine (Cl). As such, the chlorosilane-based precursor may refer to a kind of halide. Further, as used herein, the term "precursor" may refer to "a liquid precursor in a liquid state," "a precursor gas in a gaseous state," or both of them. Therefore, as used herein, the term "chlorosilane-based precursor" may refer to "a chlorosilane-based precursor in a liquid state," "a chlorosilane-based precursor in a gaseous state," or both of them. When a liquid precursor in a liquid state under normal temperature and pressure such as HCDS in a liquid state is used, the liquid precursor may be vaporized by a vaporizing system, such as a vaporizer, a bubbler, or the like, and supplied as the first process gas (e.g., HCDS gas).

A second process gas containing carbon (C) and nitrogen (N), for example, an amine-containing gas (or an amine-based gas), is supplied from the second gas supply pipe 232b into the process chamber 201 through the MFC 241b, the valve 243b, and the second nozzle 249b. As used herein, the amine-based gas refers to amine in a gaseous state, for example, a gas which is obtained by vaporizing amine in a liquid state under normal temperature and pressure, amine which is in a gaseous state under the normal temperature and pressure, and the like. An example of the amine-based gas may contain amine such as ethyl amine, methyl amine, propyl amine, isopropyl amine, butyl amine, isobutyl amine, and the like. As used herein, amine is a generic name of a compound in which a hydrogen atom in ammonia ($NH_3$) is substituted with a hydrocarbon group such as an alkyl group. As such, amine contains a hydrocarbon group such as an alkyl group or the like as a ligand containing a carbon element. The amine-based gas may contain three elements, i.e., carbon (C), nitrogen (N), and hydrogen (H), and may be referred to as a silicon-free gas in view of the fact that the amine-based gas does not contain silicon (Si) and further, a silicon-free and metal-free gas in view of the fact that the amine-based gas does not contain silicon and metal. The amine-based gas may also be a nitrogen-containing gas, a carbon-containing gas, or a hydrogen-containing gas. The amine-based gas may also be a material composed of the three elements, i.e., carbon (C), nitrogen (N), and hydrogen (H). As used herein, the term "amine" includes "amine in a liquid state," "amine in a gaseous state," or both of them. When amine in a liquid state under normal temperature and pressure such as TEA in a liquid state is used, the amine in the liquid state may be vaporized by a vaporizing system, such as a vaporizer, a bubbler, or the like, and supplied as the second process gas (e.g., TEA gas).

As a third process gas containing carbon (C), for example, a hydrocarbon-based gas, serving as a carbon source (i.e., carbon-containing gas) is supplied from the third gas supply pipe 232c into the process chamber 201 through the MFC 241c, the valve 243c, the third gas supply pipe 232c, and the third nozzle 249c. An example of the hydrocarbon-based gas may include propylene ($C_3H_6$) gas.

A fourth process gas different from each of the first to the third process gases, for example, a gas containing oxygen (O) (i.e., an oxygen-containing gas or an oxidizing gas), is supplied from the fourth gas supply pipe 232d into the process chamber 201 through the MFC 241d, the valve 243d, the third gas supply pipe 232c, and the third nozzle 249c. An example of the oxygen-containing gas (or oxidizing gas) may include oxygen ($O_2$) gas.

A fifth process gas different from each of the first to the third process gases, for example, a gas containing nitrogen (N) (i.e., a nitrogen-containing gas or a nitriding gas), is supplied from the fifth gas supply pipe 232e into the process chamber 201 through the MFC 241e, the valve 243e, the third gas supply pipe 232c, and the third nozzle 249c. An example of the nitrogen-containing gas (or nitriding gas) may include ammonia ($NH_3$) gas.

An inert gas, for example, nitrogen ($N_2$) gas, is supplied from the inert gas supply pipes 232f, 232g, and 232h into the process chamber 201 via the MFCs 241f, 241g, and 241h, the valves 243f, 243g, and 243h, the gas supply pipes 232a, 232b, and 232c, and the nozzles 249a, 249b, and 249c.

When the above-mentioned gases are supplied to flow from the gas supply pipes, the first gas supply system constitutes a precursor gas supply system for supplying a precursor gas containing a predetermined element and a halogen element, e.g., a chlorosilane-based precursor gas supply system. The chlorosilane-based precursor gas supply system may also be referred to as a chlorosilane-based precursor supply system. In addition, the second gas supply system constitutes an amine-based gas supply system. The amine-based gas supply system may also be referred to as an amine supply system. In addition, the third gas supply system constitutes a carbon-containing gas supply system which serves as a hydrocarbon-based gas supply system. In addition, the fourth gas supply system constitutes an oxygen-containing gas supply system which serves as an oxidizing gas supply system.

The exhaust pipe 231 for exhausting an internal atmosphere of the process chamber 201 is installed at the reaction tube 203. As shown in FIG. 2, when viewed from the cross sectional view, the exhaust pipe 231 is installed at a side which faces another side in which the gas supply holes 250a of the first nozzle 249a, the gas supply holes 250b of the second nozzle 249b, and the gas supply holes 250c of the third nozzle 249c are installed in the reaction tube 203. That is, the exhaust pipe 231 is installed at an opposite side to the gas supply holes 250a, 250b, and 250c with the wafers 200 interposed therebetween. In addition, as shown in FIG. 1, when viewed from the longitudinal sectional view, the exhaust pipe 231 is installed below the gas supply holes 250a, 250b, and 250c. With the above configurations, gases which are supplied from the gas supply holes 250a, 250b, and 250c to the vicinity of the wafers 200 in the process chamber 201 flow in the horizontal direction, that is, in a direction parallel to surfaces of the wafers 200, flowing downward, and then are exhausted out of the exhaust pipe 231. The main flow of the gases in the process chamber 201 in a horizontal direction, as described above.

The exhaust pipe 231 is connected with a pressure sensor 245 (i.e., pressure detecting part) for detecting an internal pressure of the process chamber 201, an auto pressure controller (APC) valve 244 serving as a pressure regulator (i.e., pressure regulating part), and a vacuum pump 246 serving as a vacuum exhaust device. The APC valve 244 is configured to perform or stop vacuum-exhaust in the process chamber 201 by opening or closing the valve while the vacuum pump 246 is actuated and further to regulate the internal pressure of the process chamber 201 by adjusting an opening degree of the valve while the vacuum pump 246 is actuated. An exhaust system mainly includes the exhaust pipe 231, the APC valve 244, and the pressure sensor 245. The exhaust system may also include the vacuum pump 246. The exhaust system is configured to, while actuating the vacuum pump 246, adjust the opening degree of the APC valve 244 based on pressure information detected by the pressure sensor 245 such that the internal pressure of the process chamber 201 is vacuum-exhausted to a predetermined pressure (i.e., a predetermined vacuum level).

A seal cap 219, which functions as a furnace port cover configured to hermetically seal a lower end portion of the reaction tube 203, is installed below the reaction tube 203. The seal cap 219 is configured to make contact with a lower end of the reaction tube 203 from its bottom in the vertical direction. The seal cap 219 is made of, for example, metal such as stainless steel or the like and formed in a disc shape. An O-ring 220 as a seal member making contact with the lower end portion of the reaction tube 203 is installed on an upper surface of the seal cap 219. A rotation mechanism 267 configured to rotate the boat 217 as a substrate support, which will be described later, is installed below the seal cap 219. A rotary shaft 255 in the rotation mechanism 267 is configured to pass through the seal cap 219 to be connected to the boat 217. The rotation mechanism 267 is configured to rotate the wafers 200 by rotating the boat 217. The seal cap 219 is configured to be vertically elevated or lowered by a boat elevator 115 as an elevation mechanism vertically installed outside the reaction tube 203. The boat elevator 115 is configured to enable the boat 217 to be loaded into or unloaded from the process chamber 201 by elevating or lowering the seal cap 219. Specifically, the boat elevator 115 is configured as a transfer device (i.e., transfer mechanism) that transfers the boat 217, i.e., the wafers 200, into and out of the process chamber 201.

The boat 217, which is used as a substrate support, is made of, for example, a heat resistant material such as quartz, silicon carbide, and the like and is configured to support the wafers 200 horizontally stacked in multiple stages with the centers of the wafers 200 concentrically aligned. In addition, a heat insulating member 218 formed of, for example, a heat resistant material such as quartz, silicon carbide, and the like is installed below the boat 217 and is configured such that the heat generated from the heater 207 is hardly transferred to the seal cap 219. The heat insulating member 218 may be configured by a plurality of heat insulating plates made of a heat resistant material such as quartz or silicon carbide and a heat insulating plate holder configured to support the heat insulating plates in a horizontal posture in a multi-stage manner.

A temperature sensor 263 serving as a temperature detector is installed in the reaction tube 203. Based on temperature information detected by the temperature sensor 263, a state of supplying an electric current to the heater 207 is adjusted such that the internal temperature of the process chamber 201 is set to a desired temperature distribution. Similar to the nozzles 249a, 249b, and 249c, the temperature sensor 263 is formed as an L-shape and installed along the inner wall of the reaction tube 203.

Figure 3:
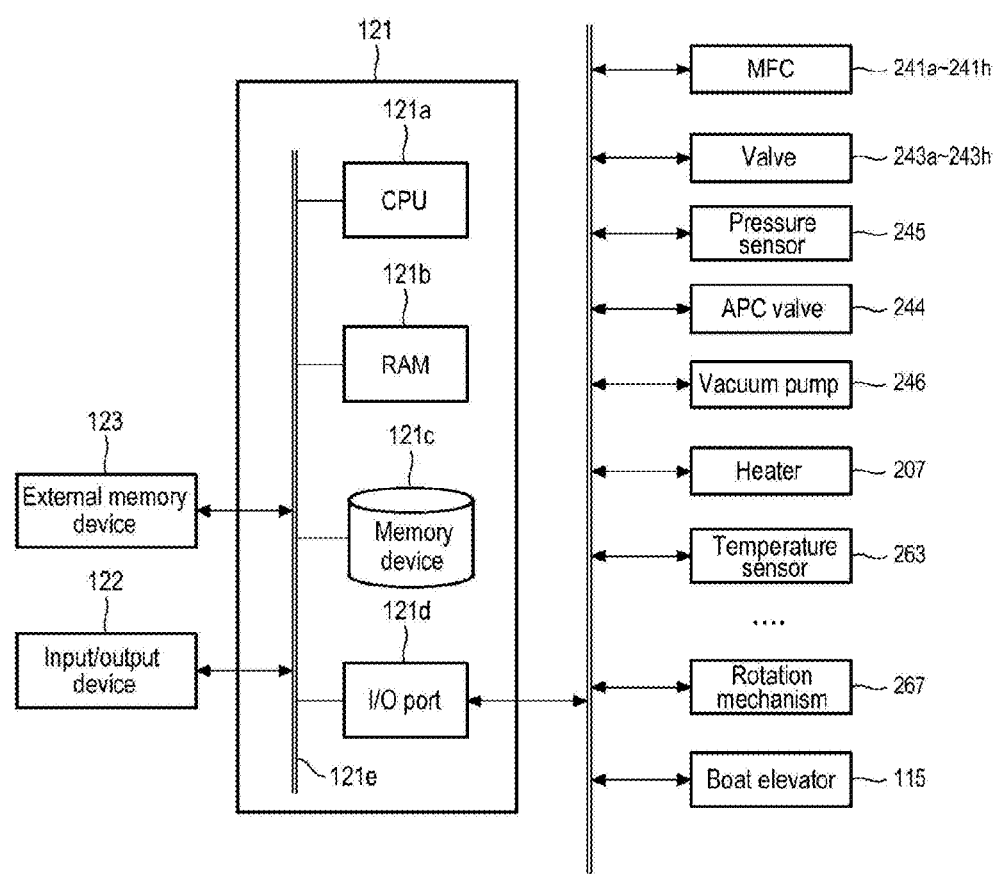
FIG. 3 schematically illustrates a configuration of a controller in the substrate processing apparatus appropriately employed in one embodiment of the present disclosure, in which its control system is shown by a block diagram.

As illustrated in FIG. 3, a controller 121 as a control unit (or control part) is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured with, for example, a flash memory, a hard disc drive (HDD), or the like. A control program for controlling operation of the substrate processing apparatus or a process recipe defining a sequence or condition for processing a substrate, which will be described later, is readably stored in the memory device 121c. The process recipe, which functions as a program, is configured to cause the controller 121 to execute individual sequences in the substrate processing process which will be described later so that predetermined results are obtained. Hereinafter, such a process recipe or a control program may be generally referred to as "a program." As used herein, the term "program" may indicate only a process recipe, only a control program, or both a process recipe and a control program. In addition, the RAM 121b is configured as a memory area (or work area) in which a program or data read by the CPU 121a may be temporarily stored.

The I/O port 121d is connected to the MFCs 241a to 241h, the valves 243a to 243h, the pressure sensor 245, the APC valve 244, the vacuum pump 246, the heater 207, the temperature sensor 263, the rotation mechanism 267, the boat elevator 115, and so on.

The CPU 121a is configured to read the control program from the memory device 121c and execute the control program. The CPU 121a is configured to read the process recipe from the memory device 121c in response to an input as an operation command from the input/output device 122. In addition, the CPU 121a is configured to, according to content of the read process recipe, control the flow rate controlling operations of various gases performed by the MFCs 241a to 241h, the opening/closing operations of the valves 243a to 243h, the opening/closing operations of the APC valve 244, the pressure regulating operation performed by the APC valve 244 based on the pressure sensor 245, the temperature regulating operation of the heater 207 based on the temperature sensor 263, the operation of starting and stopping the vacuum pump 246, the operations of rotating the boat 217 and adjusting the rotation speed of the boat 217 rotated by the rotation mechanism 267, the elevation operation of the boat 217 by the boat elevator 115, and the like.

Moreover, the controller 121 is not limited to being configured as a dedicated computer but may be configured as a general-purpose computer. For example, the controller 121 in the present embodiment may be configured by installing the above-described program on the general-purpose computer using an external memory device 123 in which the program is stored (e.g., a magnetic tape, a magnetic disc such as a flexible disc or a hard disc, an optical disc such as a CD or DVD, a magneto-optical disc such as an MO or the like, a semiconductor memory such as a USB memory or a memory card). Furthermore, means for supplying a program to a computer is not limited to the case in which the program is supplied through the external memory device 123. For example, the program may be supplied using communication means such as the Internet or a dedicated line, rather than through the external memory device 123. Moreover, the memory device 121c or the external memory device 123 may be configured as a non-transitory computer-readable recording medium. Hereinafter, these means for supplying the program will be simply referred to as "a recording medium." In addition, the term "recording medium" used herein is intended to include only the memory device 121c, only the external memory device 123, or both of them.

(2) Substrate Processing

An example of a sequence for forming a thin film on a substrate, which is one of the processes of manufacturing a semiconductor device by using the processing furnace 202 in the above-described substrate processing apparatus, is described below. In addition, in the following descriptions, operations of the respective parts constituting the substrate processing apparatus are controlled by the controller 121.

Further, in the present embodiment, a film containing at least a predetermined element and carbon is formed on the wafer 200 by performing a cycle a predetermine number of times (i.e., one or more times), the cycle including supplying a first process gas containing the predetermined element and a halogen element to the wafer 200; supplying a second process gas containing carbon and nitrogen to the wafer 200; supplying a third process gas containing carbon to the wafer 200; and supplying a fourth process gas to the wafer 200, which is different from each of the first to third process gases. According to this embodiment, in this cycle, the third process gas may be supplied at least within a period of supplying the second process gas.

In this embodiment, supply conditions of a plurality of kinds of gases containing a plurality of elements constituting a film to be formed are controlled such that the film to be formed has a stoichiometric composition ratio or a composition ratio different from the stoichiometric composition ratio. For example, the supply conditions are controlled such that at least one of several elements constituting the film to be formed is in excess of other elements in a stoichiometric composition. An example of a sequence for forming a film while controlling a film composition ratio which represents a ratio between a plurality of elements constituting the film will be described below.

Figure 4:
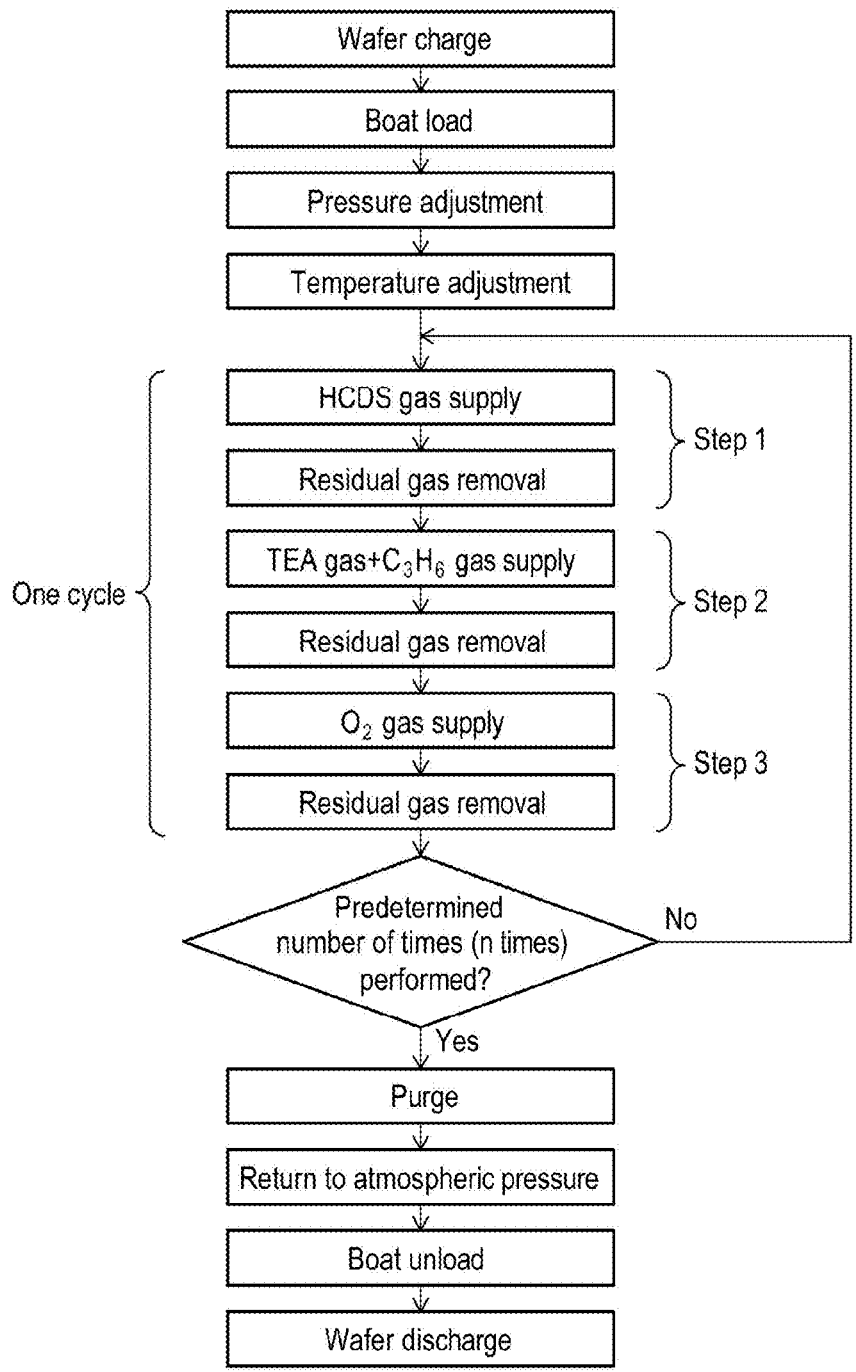
FIG. 4 illustrates a flowchart of film forming according to one embodiment of the present disclosure.
Figure 5:
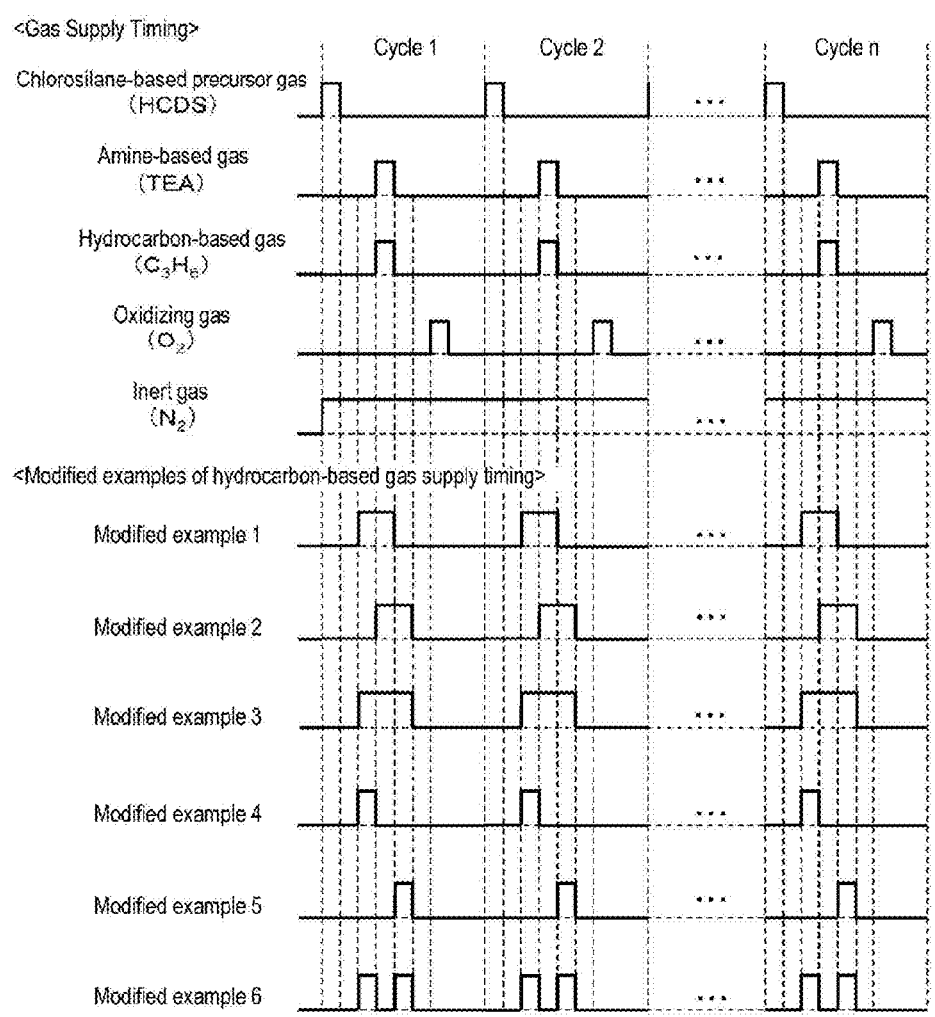
FIG. 5 illustrates gas supply timings and modified examples in a film forming sequence according to one embodiment of the present disclosure.

The film forming sequence according to the present embodiment is described below in more detail with reference to FIGS. 4 and 5. FIG. 4 illustrates a flowchart of film forming according to the present embodiment. FIG. 5 illustrates gas supply timings and modified examples in a film forming sequence according to the present embodiment.

In this embodiment, an example is described in which a silicon oxycarbonitride (SiOCN) film or a silicon oxycarbide (SiOC) film, which is a silicon-based insulating film (i.e., a film containing at least a predetermined element and carbon) having a predetermined composition and a predetermined film thickness, is formed on the wafer 200 by performing a cycle a predetermined number of times (i.e., n times), the cycle including supplying to the wafer 200 HCDS gas (i.e., a chlorosilane-based precursor gas) as a first process gas; supplying to the wafer 200 TEA gas (i.e., an amine-based gas) as a second process gas; supplying to the wafer 200 $C_3H_6$ gas (i.e., a hydrocarbon-based gas) as a third process gas; and supplying to the wafer 200 $O_2$ gas (i.e., an oxidizing gas) as a fourth process gas. Here, an example of supplying the $C_3H_6$ gas concurrently with supplying the TEA gas, in other words, an example where a $C_3H_6$ gas supplying process is performed in a period of a TEA gas supply period, but not in a TEA gas supply halt period.

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (or an exposed surface) of a wafer itself" or "a surface of a predetermined layer or film formed on a wafer, i.e., an uppermost surface of the wafer, which is a laminated body."

As such, as used herein, the phrase "a predetermined gas is supplied to a wafer" may mean that "a predetermined gas is directly supplied to a surface (or an exposed surface) of a wafer itself" or that "a predetermined gas is supplied to a layer or a film formed on a wafer, i.e., on an uppermost surface of a wafer as a laminated body." Also, as used herein, the phrase "a predetermined layer (or film) is formed on a wafer" may mean that "a predetermined layer (or film) is directly formed on a surface (or an exposed surface) of a wafer itself" or that "a predetermined layer (or film) is formed on a layer or a film formed on a wafer, i.e., on an uppermost surface of a wafer as a laminated body."

In addition, the term "substrate" as used herein may be synonymous with the term "wafer" and, in this case, the terms "wafer" and "substrate" may be used interchangeably in the above description.

(Wafer Charge and Boat Load)

When the plurality of wafers 200 is charged on the boat 217 (i.e., wafer charge), as illustrated in FIG. 1, the boat 217 supporting the plurality of wafers 200 is lifted upward by the boat elevator 115 and is loaded into the process chamber 201 (i.e., boat load). In this state, the seal cap 219 seals the lower end portion of the reaction tube 203 via the O-ring 220.

(Pressure Adjustment and Temperature Adjustment)

The interior of the process chamber 201 is vacuum-exhausted by the vacuum pump 246 to a desired pressure (or a desired vacuum level). In this case, the internal pressure of the process chamber 201 is measured by the pressure sensor 245. The APC valve 244 is feedback-controlled based on the measured pressure information (i.e., pressure regulation). The vacuum pump 246 may be continuously operated at least until the processing on the wafers 200 is completed. The wafers 200 in the process chamber 201 are heated by the heater 207 to a desired temperature. In this case, the state of supplying an electric current to the heater 207 is feedback-controlled based on the temperature information detected by the temperature sensor 263 such that the interior of the process chamber 201 reaches a desired temperature distribution (i.e., temperature adjustment). In addition, the heating of the interior of the process chamber 201 by the heater 207 may be continuously performed at least until the processing of the wafers 200 is completed. Subsequently, the boat 217 and wafers 200 begin to be rotated by the rotation mechanism 267 (i.e., wafer rotation). Furthermore, the rotation of the boat 217 and wafers 200 by the rotation mechanism 267 may be continuously performed at least until the processing of the wafers 200 is completed.

(Process of Forming Silicon Oxycarbonitride Film or Silicon Oxycarbide Film)

Next, the following three steps, i.e., Steps 1, 2, and 3, are sequentially performed.

[Step 1]

(HCDS Gas Supply)

The valve 243a of the first gas supply pipe 232a is opened to flow the HCDS gas into the first gas supply pipe 232a. A flow rate of the HCDS gas flowing in the first gas supply pipe 232a is adjusted by the MFC 241a. The flow rate-adjusted HCDS gas is supplied from the gas supply holes 250a of the first nozzle 249a into the process chamber 201 and is exhausted thorough the exhaust pipe 231. As such, the HCDS gas is supplied to the wafers 200. In this case, the valve 243f is opened to flow the N2 gas as an inert gas into the first inert gas supply pipe 232f. A flow rate of the $N_2$ gas flowing in the first inert gas supply pipe 232f is adjusted by the MFC 241f. The flow rate-adjusted $N_2$ gas is supplied into the process chamber 201, together with the HCDS gas, and is exhausted through the exhaust pipe 231.

During this operation, the valves 243g and 243h are opened to flow the $N_2$ gas into the second inert gas supply pipe 232g and the third inert gas supply pipe 232h in order to prevent infiltration of the HCDS gas into the second nozzle 249b and the third nozzle 249c. The $N_2$ gas is supplied into the process chamber 201 through the second gas supply pipe 232b, the third gas supply pipe 232c, the second nozzle 249b, and the third nozzle 249c, and is exhausted through the exhaust pipe 231.

In this case, the APC valve 244 is appropriately adjusted such that the internal pressure of the process chamber 201 falls within a range of, for example, 1 to 13,300 Pa, specifically, 20 to 1,330 Pa. The supply flow rate of the HCDS gas controlled by the MFC 241a is set to fall within a range of, for example, 1 to 1,000 sccm. The supply flow rate of the N$_2$ gas controlled by each of the MFCs 241f, 241g, and 241h is set to fall within a range of, for example, 100 to 10,000 sccm. The time for supplying the HCDS gas to the wafers 200, in other words, a gas supply time (i.e., an irradiation time), is set to fall within a range of, for example, 1 to 120 seconds, specifically, 1 to 60 seconds. In this case, the temperature of the heater 207 is set such that a temperature of the wafers 200 falls within a range of, for example, 250 to 700 degrees C., specifically, 300 to 650 degrees C., more specifically, 350 to 600 degrees C. When the temperature of the wafers 200 is less than 250 degrees C., HCDS is hardly chemically adsorbed onto the wafers 200. This may sometimes make it impossible to obtain a practical film forming rate. This problem can be solved by setting the temperature of the wafers 200 equal to or higher than 250 degrees C. Further, HCDS can be more sufficiently adsorbed onto the wafers 200 and a more sufficient film forming rate can be obtained by setting the temperature of the wafers 200 equal to or higher than 300 degrees C., or equal to or higher than 350 degrees C. When the temperature of the wafers 200 exceeds 700 degrees C., a CVD reaction becomes intensive (in other words, a gas phase reaction becomes dominant). Thus, the film thickness uniformity becomes hard to control and often deteriorates. By setting the temperature of the wafers 200 equal to or lower that 700 degrees C., deterioration of the film thickness uniformity can be suppressed and thus, it becomes possible to control the film thickness uniformity. In particular, a surface reaction becomes dominant by setting the temperature of the wafers 200, for example, equal to or lower than 650 degrees C., specifically, equal to or lower than 600 degrees C., and thus, it becomes easy to secure and control uniformity of the film thickness. Accordingly, the temperature of the wafers 200 may be set to fall within, for example, a range of 250 to 700 degrees C., specifically, 300 to 650 degrees C., more specifically, 350 to 600 degrees C.

By supplying the HCDS gas to the wafers 200 under the above conditions, an initial layer containing a predetermined element (e.g., silicon) and a halogen element (e.g., chlorine), i.e., a silicon-containing layer (or a Si-containing layer) containing chlorine (CO having a thickness, for example, from less than one atomic layer to several atomic layers is formed on the wafer 200 (or a base film of its surface). The Si-containing layer containing Cl may be an adsorption layer of the HCDS gas, a silicon layer (Si layer) containing Cl, or both of these.

Here, the phrase "Si layer containing Cl" is a generic name which encompasses a continuous or discontinuous layer that is formed of silicon (Si) and contains Cl, and a silicon thin film containing Cl that is formed by laminating such layers. The continuous layer that is formed of Si and contains Cl may be referred to as a silicon thin film containing Cl. In addition, Si constituting the silicon layer containing Cl includes Si whose bond to Cl is completely broken, in addition to Si whose bond to Cl is not completely broken.

The adsorption layer of the HCDS gas includes a continuous chemical adsorption layer in which gas molecules of the HCDS gas are continuous, and a discontinuous chemical adsorption layer in which gas molecules of the HCDS gas are discontinuous. In other words, the adsorption layer of the HCDS gas may include a chemical adsorption layer formed of HCDS molecules and having a thickness of one molecular layer or less than one molecular layer. HCDS (Si$_2$Cl$_6$) molecules that constitute the adsorption layer of the HCDS gas include one or more molecules in which a bond between Si and Cl is partially broken (e.g., Si$_x$Cl$_y$ molecules). In other words, the adsorption layer of the HCDS gas includes a continuous chemical adsorption layer and a discontinuous chemical adsorption layer of Si$_2$Cl$_6$ molecules and/or Si$_x$Cl$_y$ molecules.

A layer having a thickness of less than one atomic layer refers to a discontinuously formed atomic layer. A layer having a thickness of one atomic layer refers to a continuously formed atomic layer. In addition, a layer having a thickness of less than one molecular layer refers to a discontinuously formed molecular layer. A layer having a thickness of one molecular layer refers to a continuously formed molecular layer.

Under a condition in which the HCDS gas is autolyzed (or pyrolyzed), i.e., under a condition in which a pyrolysis reaction of the HCDS gas occurs, Si is deposited on the wafer 200 to form the Si layer containing Cl. Under a condition in which the HCDS gas is not autolyzed (or pyrolyzed), i.e., under a condition in which a pyrolysis reaction of the HCDS gas does not occur, the HCDS gas is adsorbed on the wafer 200 to form the adsorption layer of the HCDS gas. In addition, a film forming rate when the Si layer containing Cl is formed on the wafer 200 may be greater than that when the adsorption layer of the HCDS gas is formed on the wafer 200.

When the thickness of the Si-containing layer containing Cl formed on the wafer 200 exceeds several atomic layers, an effect of a modification reaction in following Steps 2 and 3, which will be described later, is not to be applied to the entire Si-containing layer containing Cl. On the other hand, a minimum value of the thickness of the Si-containing layer containing Cl that can be formed on the wafer 200 is less than one atomic layer. Accordingly, the thickness of the Si-containing layer containing Cl may range from less than one atomic layer to several atomic layers. In addition, when the thickness of the Si-containing layer containing Cl is set to be one atomic layer or less (i.e., one atomic layer or less than one atomic layer), the effect of the modification reaction in Steps 2 and 3 which will be described later can be relatively increased. This makes it possible to shorten a time required for the modification reaction in Steps 2 and 3. It is also possible to shorten a time required for forming the Si-containing layer containing Cl in Step 1. As a result, a processing time per cycle can be reduced and hence a total processing time can be shortened. As such, the film forming rate can be increased. In addition, if the thickness of the Si-containing layer containing Cl is one atomic layer or less, it becomes possible to enhance the controllability of film thickness uniformity.

(Residual Gas Removal)

After the Si-containing layer containing Cl is formed as the initial layer, the valve 243a of the first gas supply pipe 232a is closed to stop the supply of the HCDS gas. At this time, while the APC valve 244 of the exhaust pipe 231 is in an open state, the interior of the process chamber 201 is vacuum-exhausted by the vacuum pump 246 to remove from the process chamber 201 the HCDS gas remaining in the process chamber 201, which has not reacted or remains after contributing to the formation of the initial layer. In this operation, the supply of the $N_2$ gas as an inert gas into the process chamber 201 is maintained by keeping the valves 243f, 243g, and 243h in an open state. The $N_2$ gas acts as a purge gas so as to enhance the effect of removing from the process chamber 201 the HCDS gas remaining in the process chamber 201, which has not reacted or remains after contributing to the formation of the initial layer.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 2. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 2. As described above, as the interior of the process chamber 201 is purged incompletely, the purge time can be reduced and the throughput can be improved. In addition, the consumption of the $N_2$ gas can also be suppressed to a minimal necessity.

Examples of the chlorosilane-based precursor gas may include inorganic precursor gases such as tetrachlorosilane, i.e., silicon tetrachloride ($SiCl_4$, abbreviation: STC) gas, trichlorosilane ($SiHCl_3$, abbreviation: TCS) gas, dichlorosilane ($SiH_2Cl_2$, abbreviation: DCS) gas, monochlorosilane ($SiH_3Cl$, abbreviation: MCS) gas and the like, in addition to the hexachlorodisilane ($Si_2Cl_6$, abbreviation: HCDS) gas. Examples of the inert gas may include rare gases such as an Ar gas, He gas, Ne gas, Xe gas and the like, in addition to the $N_2$ gas.

[Step 2]

(TEA Gas and $C_3H_6$ Gas Supply)

After Step 1 is completed by removing the residual gas from the process chamber 201, the valve 243b of the second gas supply pipe 232b is opened to flow the TEA gas into the second gas supply pipe 232b. A flow rate of the TEA gas flowing in the second gas supply pipe 232b is adjusted by the MFC 241b. The flow rate-adjusted TEA gas is supplied from the gas supply holes 250b of the second nozzle 249b into the process chamber 201. In this case, the valve 243g is opened to flow the $N_2$ gas as an inert gas into the second inert gas supply pipe 232g. A flow rate of the $N_2$ gas flowing in the second inert gas supply pipe 232g is adjusted by the MFC 241g. The flow rate-adjusted $N_2$ gas is supplied into the process chamber 201, together with the TEA gas.

At the same time, the valve 243c of the third gas supply pipe 232c is opened to flow the $C_3H_6$ gas into the third gas supply pipe 232c. A flow rate of the $C_3H_6$ gas flowing in the third gas supply pipe 232c is adjusted by the MFC 241c. The flow rate-adjusted $C_3H_6$ gas is supplied from the gas supply holes 250c of the third nozzle 249c into the process chamber 201. In this case, the valve 243h is opened to flow the $N_2$ gas as an inert gas into the third inert gas supply pipe 232h. A flow rate of the $N_2$ gas flowing in the third inert gas supply pipe 232h is adjusted by the MFC 241h. The flow rate-adjusted $N_2$ gas is supplied into the process chamber 201, together with the $C_3H_6$ gas.

The TEA gas and the $C_3H_6$ gas supplied into the process chamber 201 are activated (or excited) by heat and are exhausted from the exhaust pipe 231, together with the $N_2$ gas supplied from the second inert gas supply pipe 232g and the third inert gas supply pipe 232h. In this embodiment, the TEA gas and the $C_3H_6$ gas activated by heat are simultaneously supplied onto the wafers 200.

During the above operation, the valve 243f is opened to flow the $N_2$ gas into the first inert gas supply pipe 232f in order to prevent infiltration of the TEA gas and the $C_3H_6$ gas into the first nozzle 249a. The $N_2$ gas is supplied into the process chamber 201 through the first gas supply pipe 232a and the first nozzle 249a and is exhausted through the exhaust pipe 231.

In this case, the APC valve 244 is appropriately adjusted such that the internal pressure of the process chamber 201 falls within a range of, for example, 1 to 13,300 Pa, specifically, 399 to 3,990 Pa. The internal pressure of the process chamber 201 is set to fall within such a relatively high pressure range so as to allow the TEA gas and the $C_3H_6$ gas to be thermally activated under non-plasma conditions. In addition, when the TEA gas and the $C_3H_6$ gas are thermally activated and supplied, it is possible to generate a relatively soft reaction so as to perform the modification more softly, which will be described later. The supply flow rate of the TEA gas controlled by the MFC 241b is set to fall within a range of, for example, 100 to 2,000 sccm. The supply flow rate of the $C_3H_6$ gas controlled by the MFC 241c is set to fall within a range of, for example, 100 to 10,000 sccm. The supply flow rate of the $N_2$ gas controlled by each of the MFCs 241g, 241h, and 241f is set to fall within a range of, for example, 100 to 10,000 sccm. Further, the partial pressure of the TEA gas in the process chamber 201 is set to fall within a range of, for example, 0.01 to 12,667 Pa and the partial pressure of the $C_3H_6$ gas in the process chamber 201 is set to fall within a range of, for example, 0.01 to 13,168 Pa. The time for which the thermally activated TEA gas and $C_3H_6$ gas are supplied onto the wafers 200, in other words, a gas supply time (i.e., an irradiation time), is set to fall within a range of, for example, 1 to 120 seconds, specifically, 1 to 60 seconds. In this case, the temperature of the heater 207 is set such that the temperature of the wafers 200 falls within a range of, for example, 250 to 700 degrees C., specifically, 300 to 650 degrees C., more specifically, 350 to 600 degrees C., in the same manner as described with respect to Step 1.

Under the above conditions, when the TEA gas is supplied onto the wafer 200, the Si-containing layer containing Cl, which is the initial layer formed on the wafer 200 in Step 1, reacts with the TEA gas. Thus, the atoms (e.g., the Cl atoms) of the halogen element (e.g., Cl) in the Si-containing layer containing Cl serving as the initial layer react with ligands (e.g., ethyl group) in the TEA gas. Accordingly, at least a portion of the Cl atoms in the initial layer are extracted (or separated) from the initial layer and at least a portion of ethyl groups in the TEA gas are separated from the TEA gas. Then, N in the TEA gas from which at least the portion of ethyl groups is separated can be combined with Si contained in the initial layer. Thus, N constituting the TEA gas and having a dangling bond which is generated by the separation of at least the portion of ethyl groups can be combined with Si getting to have a dangling bond when it is introduced into and contained in the initial layer or having had a dangling bond already, thereby forming a Si—N bond. At this time, C in the ethyl groups (—$CH_2CH_3$) separated from the TEA gas can also be combined with Si contained in the initial layer, thereby forming a Si—C bond. As a result, Cl is separated from the initial layer and an N component is introduced into the initial layer. Here, a new C component is also introduced into the initial layer.

In addition, by performing the process of supplying the $C_3H_6$ gas to the wafers 200 concurrently with performing the process of supplying the TEA gas to the wafers 200, in other words, by performing the $C_3H_6$ gas supplying process at least in a period of supplying the TEA gas, the C component in the $C_3H_6$ gas is also newly introduced into the initial layer. As such, by supplying the $C_3H_6$ gas to the wafers 200, and the $C_3H_6$ gas is adsorbed on a surface of the initial layer and, at this time, the C component in the $C_3H_6$ gas is newly introduced into the initial layer. For example, C in the $C_3H_6$ gas can be combined with Si in the initial layer, thereby forming a Si—C bond.

When the TEA gas and the $C_3H_6$ gas are supplied under the above conditions, the Si-containing layer containing Cl serving as the initial layer reacts with the TEA gas and the $C_3H_6$ gas so that the above-described series of reactions occurs. According to the series of reactions, Cl is separated from the initial layer, the N and the C components are newly introduced into the initial layer, and the Si-containing layer containing Cl serving as the initial layer is changed (or modified) into a first layer containing silicon (Si), nitrogen (N), and carbon (C), for example, a silicon carbonitride (SiCN) layer. The first layer is formed as a layer containing Si, N, and C and having a thickness, for example, from less than one atomic layer to several atomic layers. The first layer has relatively high ratios of Si and C components, i.e., a Si-rich and C-rich layer.

As described above, not only the C component in the TEA gas but also the C component in the $C_3H_6$ gas are newly introduced into the first layer. Accordingly, the first layer is formed to be C-richer than a layer that can be obtained by modifying the initial layer without supplying the $C_3H_6$ gas to the wafer 200 (i.e., a layer obtained by modifying the initial layer by supplying only the TEA gas to the wafer 200).

In addition, when the layer containing Si, N, and C which serves as the first layer is formed, the chlorine (Cl) in the Si-containing layer containing Cl or the hydrogen (H) in the TEA gas and the $C_3H_6$ gas forms materials in a gaseous state such as chlorine ($Cl_2$) gas, hydrogen ($H_2$) gas, hydrogen chloride (HCl) gas, and the like, during the modification reaction of the Si-containing layer containing Cl by the TEA gas and the $C_3H_6$ gas, and then exhausted from the process chamber 201 through the exhaust pipe 231. As such, an impurity such as Cl or the like in the initial layer is separated from the initial layer as it is drawn out or escapes from the initial layer. This allows the first layer to have less Cl impurity than the initial layer.

(Residual Gas Removal)

After the first layer is formed, the valve 243b of the second gas supply pipe 232b and the valve 243c of the third gas supply pipe 232c are closed to stop the supply of the TEA gas and the $C_3H_6$ gas. At this time, while the APC valve 244 of the exhaust pipe 231 is in an open state, the interior of the process chamber 201 is vacuum-exhausted by the vacuum pump 246 to remove from the process chamber 201 the TEA gas and the $C_3H_6$ gas, which have not reacted or remain after contributing to the formation of the first layer, and reaction byproducts remaining in the process chamber 201. In this operation, the supply of the $N_2$ gas serving as an inert gas into the process chamber 201 is maintained by keeping the valves 243g, 243h, and 243f in an open state. The $N_2$ gas acts as a purge gas so as to enhance the effect of removing from the process chamber 201 the TEA and the $C_3H_6$ gases, which have not reacted or remain after contributing to the formation of the first layer, and reaction byproducts remaining in the process chamber 201.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 3. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 3. As described above, as the interior of the process chamber 201 is purged incompletely, the purge time can be reduced and the throughput can be improved. In addition, the consumption of the $N_2$ gas can also be suppressed to a minimal necessity.

Examples of the amine-based gas may include ethylamine-based gases such as diethylamine (($C_2H_5$)$_2$NH, abbreviation: DEA) gas, monoethylamine ($C_2H_5NH_2$, abbreviation: MEA) gas or the like; methylamine-based gases such as a trimethylamine (($CH_3$)$_3$N, abbreviation: TMA) gas, dimethylamine (($CH_3$)$_2$NH, abbreviation: DMA) gas, monomethylamine ($CH_3NH_2$, abbreviation: MMA) gas or the like; propylamine-based gases such as a tripropylamine (($C_3H_7$)$_3$N, abbreviation: TPA) gas, dipropylamine (($C_3H_7$)$_2$NH, abbreviation: DPA) gas, monopropylamine ($C_3H_7NH_2$, abbreviation: MPA) gas or the like; isopropylamine-based gases such as triisopropylamine ([($CH_3$)$_2$CH]$_3$N, abbreviation: TIPA) gas, diisopropylamine ([($CH_3$)$_2$CH]$_2$NH, abbreviation: DIPA) gas, monoisopropylamine (($CH_3$)$_2$CHNH$_2$, abbreviation: MIPA) gas or the like; butylamine-based gases such as tributylamine (($C_4H_9$)$_3$N, abbreviation: TBA) gas, dibutylamine (($C_4H_9$)$_2$NH, abbreviation: DBA) gas, monobutylamine ($C_4H_9NH_2$, abbreviation: MBA) gas or the like; or isobutylamine-based gases such as triisobutylamine ([($CH_3$)$_2$CHCH$_2$]$_3$N, abbreviation: TIBA) gas, diisobutylamine ([($CH_3$)$_2$CHCH$_2$]$_2$NH, abbreviation: DIBA) gas, monoisobutylamine (($CH_3$)$_2$CHCH$_2$NH$_2$, abbreviation: MIBA) gas or the like, in addition to the triethylamine (($C_2H_5$)$_3$N, abbreviation: TEA). That is, examples of the amine-based gas may include at least one gas of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$ and $[(CH_3)_2CHCH_2]_xNH_{3-x}$ (where x is an integer from 1 to 3).

In addition, a gas composed of three elements, i.e., carbon (C), nitrogen (N), and hydrogen (H) and having more C atoms than N atoms in its composition formula (e.g., in one molecule) may be used as the amine-based gas. Thus, the amine-based gas may be a gas containing at least one amine group, selected from a group consisting of TEA, DEA, MEA, TMA, DMA, TPA, DPA, MPA, TIPA, DIPA, MIPA, TBA, DBA, MBA, TIBA, DIBA, and MIBA.

When the first process gas is a chlorosilane-based precursor gas containing the predetermined element (Si) and the halogen element (Cl), such as HCDS gas or the like, the second process gas may be an amine-based gas composed of three elements, i.e., C, N, and H and having more C atoms than N atoms in its composition formula (e.g., in one molecule), such as TEA gas, DEA gas, or the like, so as to increase the C concentration in the first layer formed in Step 2, ultimately, the C concentration in the SiOCN film or the SiOC film formed in a process performed a predetermined number of times, which will be described later.

In contrast, when the first process gas is a chlorosilane-based precursor gas containing Si and Cl, such as HCDS gas or the like, and the second process gas is a gas composed of three elements, i.e., C, N, and H and having not more C atoms than N atoms in its composition formula (e.g., in one molecule), for example, an amine-based gas such as MMA gas or the like, or an organic hydrazine-based gas (which will be described later) such as MMH gas, DMH gas or the like, the C concentration in the first layer, ultimately, the C concentration in the SiOCN film or the SiOC film may not be increased as much as a case where the second process gas is an amine-based gas composed of three elements, i.e., C, N, and H and having more C atoms than N atoms in its composition formula (e.g., in one molecule), thereby making it difficult to realize an appropriate C concentration.

In addition, a gas having a plurality of ligands containing C atoms in its composition formula (e.g., in one molecule), for example, a gas having a plurality of hydrocarbon groups such as alkyl groups in its composition formula (e.g., in one molecule), may be used as the amine-based gas. Specifically, the amine-based gas may be a gas having two or three ligands (e.g., hydrocarbon groups such as alkyl groups) containing C atoms in its composition formula (e.g., in one molecule) may be used as the organic hydrazine-based gas. Further, the amine-based gas may be a gas containing at least one amine group, selected from a group consisting of TEA, DEA, TMA, DMA, TPA, DPA, TIPA, DIPA, TBA, DBA, TIBA, and DIBA.

When the first process gas is a chlorosilane-based precursor gas containing Si and Cl, such as the HCDS gas or the like, the second process gas may be an amine-based gas composed of three elements, i.e., C, N, and H and having a plurality of ligands containing C atoms in its composition formula (e.g., in one molecule), for example, a gas having a plurality of hydrocarbon groups such as alkyl groups in its composition formula (e.g., in one molecule), such as TEA gas, DEA gas or the like, so as to increase the C concentration in the first layer, ultimately, the C concentration in the SiOCN film or the SiOC film.

In contrast, when the first process gas is a chlorosilane-based precursor gas including Si and Cl, such as the HCDS gas or the like, and the second process gas is a gas not having a plurality of ligands containing C atoms in its composition formula (e.g., in one molecule), for example, an amine-based gas such as MMA gas or the like, or an organic hydrazine-based gas (which will be described later) such as MMH gas or the like, the C concentration in the first layer, ultimately, the C concentration in the SiOCN film or the SiOC film may not be increased as much as the case where the second process gas is an amine-based gas having a plurality of ligands containing C atoms in its composition formula (e.g., in one molecule), thereby making it difficult to realize an appropriate C concentration.

In addition, if the second process gas is an amine-based gas having two ligands containing C atoms (e.g., hydrocarbon groups such as alkyl groups) in its composition formula (e.g., in one molecule), such a DEA gas or the like, it can achieve a higher cycle rate (which means a thickness of a SiOCN layer or a SiOC layer formed per cycle) and a higher ratio of N concentration to C concentration (i.e., N concentration/C concentration) in the first layer (ultimately, a higher ratio of N concentration to C concentration (N concentration/C concentration) in the SiOCN film or the SiOC film) than a case of using an amine-based gas having three ligands containing C atoms (e.g., hydrocarbon groups such as alkyl groups) in its composition formula (e.g., in one molecule), such a TEA gas or the like.

In contrast, if the second process gas is an amine-based gas having three ligands containing C atoms (e.g., hydrocarbon groups such as alkyl groups) in its composition formula (e.g., in one molecule), such a TEA gas or the like, the gas can achieve a higher ratio of C concentration to N concentration (C concentration/N concentration) in the first layer (ultimately, a higher ratio of C concentration to N concentration (C concentration/N concentration) in the SiOCN film or the SiOC film) than a case of using an amine-based gas having two ligands containing C atoms (e.g., hydrocarbon groups such as alkyl groups) in its composition formula (In one molecule), such as DEA gas or the like.

In other words, it is possible to finely adjust the cycle rate and the N and the C concentrations in the formed SiOCN film or SiOC film depending on the number of ligands containing the C atoms (e.g., hydrocarbon groups such as alkyl groups) contained in the second process gas, in other words, by appropriately changing the kind of the second process gas.

In addition, the third process gas may be a hydrocarbon-based gas such as an acetylene ($C_2H_2$) gas, ethylene ($C_2H_4$) gas or the like, i.e., a carbon-containing gas containing no nitrogen, in addition to the propylene ($C_3H_6$) gas.

When the third process gas is a hydrocarbon-based gas containing C atoms but no N atoms in its composition ratio (e.g., in one molecule), a N component originating from the third process gas can be prevented from being added to the initial layer, i.e., the first layer, when the third process gas is supplied to the wafer 200 in Step 2. In other words, a nitrogen source for addition of the N component to the first layer is only the second process gas. As a result, it is possible to control the increase in the N concentration while increasing the C concentration in the SiOCN film or the SiOC film in the process of performing a predetermined number of times, which will be described later.

As described above, by appropriately selecting the kind (or composition) of the second process gas and/or the kind (or composition) of the third process gas, it is possible to increase the C concentration in the SiOCN film or the SiOC film.

In addition, in order to further increase the C concentration in the SiOCN film or the SiOC film, for example, the internal pressure of the process chamber 201 when the TEA gas and the $C_3H_6$ gas are simultaneously supplied to the wafers 200 may be set to be higher than the internal pressure of the process chamber 201 when the HCDS gas is supplied to the wafers 200 in Step 1 and also the internal pressure of the process chamber 201 when the $O_2$ gas is supplied to the wafers 200 in Step 3 which will be described later. In addition, in this case, the internal pressure of the process chamber 201 when the $O_2$ gas is supplied to the wafers 200 in Step 3 may be set to be higher than the internal pressure of the process chamber 201 when the HCDS gas is supplied to the wafers 200 in Step 1. The internal pressure of the process chamber 201 when the HCDS gas is supplied to the wafers 200 may be referred to as $P_1$ [Pa], the internal pressure of the process chamber 201 when the TEA gas and the $C_3H_6$ gas are supplied to the wafers 200 may be referred to as $P_2$ [Pa], and the internal pressure of the process chamber 201 when the $O_2$ gas is supplied to the wafers 200 may be referred to as $P_3$ [Pa]. In this case, the pressures $P_1$ to $P_3$ may be set to satisfy relationships of $P_2 > P_1$ and $P_2 > P_3$, further, a relationship of $P_2 > P_3 > P_1$. As such, the internal pressure of the process chamber 201 when the TEA gas and the $C_3H_6$ gas are supplied to the wafers 200 may be set to the highest pressure among Steps 1 to 3. The hydrocarbon-based gas such as the $C_3H_6$ gas or the like has a tendency that it is relatively hard to be adsorbed onto the initial layer. However, by setting the internal pressure of the process chamber 201 in Steps 1 to 3 as described above, adsorption of the $C_3H_6$ gas onto the initial layer can be promoted and reaction of the initial layer with the TEA gas can be accelerated, which can result in a higher C concentration in the first layer formed in Step 2 (and, ultimately, in the SiOCN film or the SiOC film).

In contrast, in order to appropriately control an amount of increase in the C concentration in the SiOCN film or the SiOC film, the internal pressure of the process chamber 201 when the TEA gas and the $C_3H_6$ gas are supplied to the wafers 200 may be set to be equal to or lower than the internal pressure of the process chamber 201 when the $O_2$ gas is supplied to the wafer 200 in Step 3 (which will be described later) and the internal pressure of the process chamber 201 when the HCDS gas is supplied to the wafer 200 in Step 1. In this case, the pressures $P_1$ to $P_3$ may be set to satisfy a relationship of $P_3 \geq P_2$ and further relationships of $P_3 \geq P_2$ and $P_1 \geq P_2$.

In brief, by appropriately controlling the internal pressure of the process chamber 201 when the TEA gas and the $C_3H_6$ gas are supplied, in other words, by appropriately controlling the internal pressure of the process chamber 201 in the $C_3H_6$ gas supplying process and/or the internal pressure of the process chamber 201 in the TEA gas supplying process, it is possible to finely adjust the C concentration in the SiOCN film or SiOC film.

In addition to the above-described control of the internal pressure of the process chamber 201 when the TEA gas and the $C_3H_6$ gas are supplied, the C concentration in the SiOCN film or SiOC film can be finely adjusted by controlling supply conditions such as supply times, supply flow rates of the TEA gas and the $C_3H_6$ gas, and so on.

For example, the C concentration in the SiOCN film or SiOC film can be further increased by extending supply times of the TEA gas and the $C_3H_6$ gas or increasing supply flow rates of the TEA gas and the $C_3H_6$ gas in Step 2. In addition, for example, the C concentration in the SiOCN film or SiOC film can be increased by increasing a ratio of the $C_3H_6$ gas supply flow rate to the TEA gas supply flow rate, i.e., by setting a partial pressure of the $C_3H_6$ gas in the process chamber 201 to be greater than a partial pressure of the TEA gas in the process chamber 201.

In addition, for example, the amount of increase in the C concentration in the SiOCN film or SiOC film can be appropriately controlled by reducing supply times of the TEA gas and the $C_3H_6$ gas or decreasing supply flow rates of the TEA gas and the $C_3H_6$ gas in Step 2. In addition, for example, the amount of increase in the C concentration in the SiOCN film or SiOC film can be appropriately controlled by decreasing a ratio of the $C_3H_6$ gas supply flow rate to the TEA gas supply flow rate, i.e., by setting a partial pressure of the $C_3H_6$ gas in the process chamber 201 to be smaller than a partial pressure of the TEA gas in the process chamber 201.

In this manner, by controlling the supply conditions (i.e., gas supply time, supply flow rate, partial pressure, internal pressure of the process chamber 201, etc.) in the TEA gas and $C_3H_6$ gas supplying process.

Examples of the inert gas may include rare gases such as an Ar gas, He gas, Ne gas, Xe gas and the like, in addition to the $N_2$ gas.

[Step 3]
($O_2$ Gas Supply)

After Step 2 is completed by removing the residual gas from the process chamber 201, the valve 243d of the fourth gas supply pipe 232d is opened to flow the $O_2$ gas into the fourth gas supply pipe 232d. A flow rate of the $O_2$ gas flowing in the fourth gas supply pipe 232d is adjusted by the MFC 241d. The flow rate-adjusted $O_2$ gas flows into the third gas supply pipe 232c and is supplied from the gas supply holes 250c of the third nozzle 249c into the process chamber 201. The $O_2$ gas supplied into the process chamber 201 is activated (or excited) by heat and is exhausted through the exhaust pipe 231. As such, the $O_2$ gas activated by heat is supplied onto the wafer 200. In this case, the valve 243h is opened to allow the $N_2$ gas to flow into the third inert gas supply pipe 232h. The $N_2$ gas is supplied into the process chamber 201, together with the $O_2$ gas, and is exhausted through the exhaust pipe 231.

During this operation, the valves 243f and 243g are opened to allow the $N_2$ gas to flow into the first inert gas supply pipe 232f and the second inert gas supply pipe 232g in order to prevent the infiltration of the $O_2$ gas into the first nozzle 249a and the second nozzle 249b. The $N_2$ gas is supplied into the process chamber 201 through the first gas supply pipe 232a, the second gas supply pipe 232b, the first nozzle 249a, and the second nozzle 249b, and is exhausted through the exhaust pipe 231.

In this case, the APC valve 244 is appropriately adjusted such that the internal pressure of the process chamber 201 falls within a range of, for example, 1 to 3,000 Pa. The internal pressure of the process chamber 201 is set to fall within such a relatively high pressure range so as to allow the $O_2$ gas to be thermally activated under non-plasma conditions. In addition, when the $O_2$ gas is thermally activated and supplied, it is possible to generate a relatively soft reaction so as to perform the oxidation more softly, which will be described later. The supply flow rate of the $O_2$ gas controlled by the MFC 241d is set to fall within a range of, for example, 100 to 10,000 sccm. The supply flow rate of the $N_2$ gas controlled by each of the MFCs 241h, 241f, and 241g is set to fall within a range of, for example, 100 to 10,000 sccm. Further, the partial pressure of the $O_2$ gas in the process chamber 201 is set to fall within a range of 0.01 to 2,970 Pa. The time period for which the thermally activated $O_2$ gas is supplied onto the wafers 200, in other words, a gas supply time (i.e., an irradiation time), is set to fall within a range of, for example, 1 to 120 seconds, specifically, 1 to 60 seconds. In this case, the temperature of the heater 207 is set such that the temperature of the wafers 200 falls within a range of, for example, 250 to 700 degrees C., specifically, 300 to 650 degrees C., more specifically, 350 to 600 degrees C., in the same manner as described with respect to Steps 1 and 2.

Here, the $O_2$ gas thermally activated by the high internal pressure of the process chamber 201 flows into the process chamber 201 and none of the HCDS gas, the TEA gas, and the $C_3H_6$ gas flows into the process chamber 201. Therefore, the thermally activated $O_2$ gas reacts with at least a portion of the first layer containing Si, N, and C formed on the wafer 200 in Step 2, without causing any gaseous reaction. This reaction oxidizes the first layer to be modified into a layer containing Si, O, C, and N (e.g., a silicon oxycarbonitride (SiOCN) layer) or a layer containing Si, O, and C (e.g., a silicon oxycarbide (SiOC) layer) serving as the second layer.

When the thermally activated $O_2$ gas flows into the process chamber 201, the first layer is thermally oxidized and modified (or changed) into the SiOCN layer or the SiOC layer. Here, addition of an O component into the first layer modifies the first layer into the SiOCN layer or the SiOC layer. In this case, the thermal oxidation by the $O_2$ gas increases Si—O bonds in the first layer, while decreasing Si—N bonds, Si—C bonds, and Si—Si bonds, so that ratios of N, C, and Si components in the first layer are reduced. Further, by extending a thermal oxidation time or increasing an oxidizing power in the thermal oxidation, the N component can be mostly extracted to be decreased to an impurity level or to be substantially extinguished. Thus, the first layer can be modified into the SiOCN layer or the SiOC layer while changing the composition ratio in such a manner that the O concentration is increased whereas the N, the C, and the Si concentrations are decreased. As such, by controlling process conditions such as the gas supply time, the supply flow rate, the partial pressure, the internal pressure of the process chamber 201, and the like, the ratio of the components in the SiOCN layer or the SiOC layer, that is to say, the O concentration, can be finely adjusted and the composition ratio of the SiOCN layer or the SiOC layer can be more precisely controlled.

In addition, it is confirmed in the above that the C component in the first layer formed in Steps 1 and 2 is richer than the N component. For example, some experiments reveal that the C concentration is two times or more as high as the N concentration. If the oxidation is stopped before the N component is entirely extracted from the first layer due to the thermal oxidation of the $O_2$ gas, i.e., under a state where the N component remains in the first layer, the first layer is modified into the SiOCN layer since the C component and the N component are left in the first layer. Furthermore, although the N component is mostly extracted from the first layer by the thermal oxidation of the $O_2$ gas, the C component is left in the first layer. If the oxidation is stopped in such a state, the first layer is modified into the SiOC layer. Therefore, by controlling the gas supply time (or oxidation time) or the oxidizing power, it is possible to control the ratio of the C component, i.e., the C concentration, and form one of the SiOCN layer and the SiOC layer while controlling its composition ratio. As such, by controlling process conditions such as the gas supply time, the flow rate, the partial pressure, the internal pressure of the process chamber 201, and the like, the ratio of O component in the SiOCN layer or the SiOC layer, i.e., the O concentration, can be finely adjusted and the composition ratio of the SiOCN layer or the SiOC layer can be more precisely controlled.

Here, the oxidation reaction of the first layer may not be saturated. For example, when the first layer having a thickness from less than one atom layer to several atomic layers is formed in Steps 1 and 2, a portion of the first layer may be oxidized. In this case, the oxidation is performed in such a manner that the oxidation reaction of the first layer is unsaturated in order to prevent the entire first layer having the thickness from less than one atom layer to several atomic layers from being oxidized.

Although the unsaturation of the oxidation reaction of the first layer may be achieved under the above process conditions employed in Step 3, it can be more easily achieved by setting the process conditions of Step 3 to the following process conditions.

Wafer temperature: 500 to 650 degrees C.
Internal pressure of process chamber: 133 to 2,666 Pa
$O_2$ gas partial pressure: 33 to 2,515 Pa
Flow rate of supplied $O_2$ gas: 1000 to 5,000 sccm
Flow rate of supplied $N_2$ gas: 300 to 3,000 sccm
$O_2$ gas supply time: 6 to 60 seconds (Residual Gas Removal)

After the second layer is formed, the valve 243d of the fourth gas supply pipe 232d is closed to stop the supply of the $O_2$ gas. At this time, while the APC valve 244 of the exhaust pipe 231 is in an open state, the interior of the process chamber 201 is vacuum-exhausted by the vacuum pump 246 to remove from the process chamber 201 the $O_2$ gas, which has not reacted or remains after contributing to the formation of the second layer, and reaction byproducts remaining in the process chamber 201. In this operation, the supply of the $N_2$ gas into the process chamber 201 is maintained by keeping the valves 243h, 243f and 243g in an open state. The $N_2$ gas acts as a purge gas so as to enhance the effect of removing from the process chamber 201 the $O_2$ gas, which has not reacted or remains after contributing to the formation of the second layer, and reaction byproducts remaining in the process chamber 201.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 1. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 1. As described above, as the interior of the process chamber 201 is purged incompletely, the purge time can be reduced and the throughput can be improved. In addition, the consumption of the $N_2$ gas can also be suppressed to a minimal necessity.

Examples of the oxygen-containing gas may include nitrous oxide ($N_2O$) gas, nitrogen monoxide (NO) gas, nitrogen dioxide ($NO_2$) gas, ozone ($O_3$) gas, hydrogen ($H_2$) gas+oxygen ($O_2$) gas, $H_2$ gas+$O_3$ gas, vapor ($H_2O$) gas, carbon monoxide (CO) gas, carbon dioxide ($CO_2$) gas, and the like, in addition to the $O_2$ gas. Examples of the inert gas may include rare gases such as an Ar gas, He gas, Ne gas, Xe gas, and the like, in addition to the $N_2$ gas.

(Performing Predetermined Number of Times)

When one cycle including Steps 1 to 3 is performed one or more times (e.g., a predetermined number of times), a film containing Si, O, C, and N (e.g., a SiOCN film) or a film containing Si, O, and C (e.g., a SiOC film) having a predetermined composition and thickness can be formed on the wafer 200. This cycle may be repeated a plurality of times. Thus, a thickness of the SiOCN layer or SiOC the layer formed per cycle may be set to be smaller than a desired film thickness and the cycle may be repeated a plurality of times until the desired film thickness is obtained.

In addition, when the cycle is performed a plurality of times, the phrase "a predetermined gas is supplied to the wafer 200" in each step after at least two cycles may mean that the predetermined gas is supplied to a layer formed on the wafer 200, i.e., an uppermost surface of the wafer 200, which is a laminated body. The phrase "a predetermined layer is formed on the wafer 200" may mean that the predetermined layer is formed on a layer formed on the wafer 200, i.e., an uppermost surface of the wafer 200, which is a laminated body. Also, the above-described matters are similar in respective modifications and other embodiments which will be described later.

(Purge and Return to Atmospheric Pressure)

Once the process of forming the SiOCN film or the SiOC film having a predetermined composition and a predetermined film thickness is completed, the valves 243f, 243g, and 243h are opened to supply the $N_2$ gas serving as an inert gas from each of the first inert gas supply pipe 232f, the second inert gas supply pipe 232g, and the third inert gas supply pipe 232h into the process chamber 201 and the $N_2$ gas is exhausted through the exhaust pipe 231. The $N_2$ gas acts as a purge gas and the interior of the process chamber 201 is purged with the inert gas, so that the gas and reaction byproducts remaining in the process chamber 201 are removed from the process chamber 201 (i.e., purge). Subsequently, the internal atmosphere of the process chamber 201 is substituted with the inert gas (i.e., inert gas substitution), and the internal pressure of the process chamber 201 returns to the normal pressure (i.e., return to atmospheric pressure).

(Boat Unload and Wafer Discharge)

Thereafter, the seal cap 219 is lowered by the boat elevator 115 to open the lower end of the reaction tube 203, and the processed wafers 200 supported by the boat 217 are unloaded outside of the reaction tube 203 through the lower end of the reaction tube 203 (i.e., boat unload). Then, the processed wafers 200 are discharged from the boat 217 (i.e., wafer discharge).

(3) Effects According to the Present Embodiment

According to the present embodiment, one or more effects may be achieved as described below.

(a) According to the present embodiment, by simultaneously performing the process of supplying the hydrocarbon-based gas (e.g., $C_3H_6$ gas) serving as the third process gas to the wafers 200 and the process of supplying the amine-based gas (e.g., TEA gas) serving as the second process gas to the wafers 200, that is to say, by performing the $C_3H_6$ gas supplying process within at least a period of supplying the TEA gas process, the C component in the amine-based gas and the C component in the $C_3H_6$ gas can be newly added to the first layer so as to increase the C concentration in the SiOCN film or the SiOC film.

(b) According to the present embodiment, by simultaneously performing the process of supplying the $C_3H_6$ gas to the wafers 200 and the process of supplying the TEA gas to the wafers 200, the time required per cycle can be reduced as compared to when those processes are separately performed.

(c) According to the present embodiment, by using the hydrocarbon-based gas (e.g., $C_3H_6$ gas) containing C atoms but not N atoms in its composition formula (e.g., in one molecule) as the third process gas, it is possible to prevent the N component from being added into the first layer when the third process gas is supplied to the wafers 200 in Step 2. Thus, increase of the C concentration in the SiOCN film or the SiOC film can be facilitated while preventing the N concentration in the film from being increased.

(d) According to the present embodiment, by appropriately controlling the supply conditions for the TEA gas supplying process and the $C_3H_6$ gas supplying process (e.g., gas supply time, flow rate, internal pressure of the process chamber 201, partial pressure of the $C_3H_6$ gas, and the like), the C concentration in the SiOCN film or the SiOC film can be finely adjusted.

For example, by setting the internal pressure of the process chamber 201 in the processes of supplying the TEA gas and the $C_3H_6$ gas to the wafers 200 in Step 2 to be greater than the internal pressure of the process chamber 201 in the process of supplying the HCDS gas to the wafer 200 in Step 1, the C concentration in the SiOCN film or the SiOC film can be increased further. In addition, by setting the internal pressure of the process chamber 201 in the processes of supplying the TEA gas and the $C_3H_6$ gas to the wafers 200 to be greater than the internal pressure of the process chamber 201 in the process of supplying the $O_2$ gas to the wafers 200 in Step 3, the C concentration in the SiOCN film or the SiOC film can be increased even further.

In addition, for example, by setting the internal pressure of the process chamber 201 in the processes of supplying the TEA gas and the $C_3H_6$ gas to the wafers 200 in Step 2 to be smaller than the internal pressure of the process chamber 201 in the process of supplying the $O_2$ gas to the wafers 200 in Step 3 or the internal pressure of the process chamber 201 in the process of supplying the HCDS gas to the wafer 200s in Step 1, the amount of increase of the C concentration in the SiOCN film or the SiOC film can be appropriately controlled.

In addition, for example, by extending the gas supply times of the TEA gas and the $C_3H_6$ gas or increasing the supply flow rates of the TEA gas and the $C_3H_6$ gas in the process of supplying the TEA gas and the $C_3H_6$ gas in Step 2, the C concentration in the SiOCN film or the SiOC film can be increased further. In addition, for example, by increasing the ratio of the $C_3H_6$ gas supply flow rate to the TEA gas supply flow rate (i.e., the $C_3H_6$ gas supply flow rate/the TEA gas supply flow rate) in the TEA gas supplying process and the $C_3H_6$ gas supplying process, in other words, by setting the partial pressure of the $C_3H_6$ gas to be greater than the partial pressure of the TEA gas in the process chamber 201, the C concentration in the SiOCN film or the SiOC film can be increased efficiently while preventing the N concentration in the film from being increased.

In contrast, for example, by reducing the gas supply times of the TEA gas and the $C_3H_6$ gas or decreasing the supply flow rates of the TEA gas and the $C_3H_6$ gas in the process of supplying the TEA gas and the $C_3H_6$ gas in Step 2, the increase of the C concentration in the SiOCN film or the SiOC film can be controlled appropriately. In addition, for example, by decreasing the ratio of the $C_3H_6$ gas supply flow rate to the TEA gas supply flow rate (i.e., the $C_3H_6$ gas supply flow rate/the TEA gas supply flow rate), in other words, by setting the partial pressure of the $C_3H_6$ gas to be smaller than the partial pressure of the TEA gas in the process chamber 201, the increase of the C concentration in the SiOCN film or the SiOC film can be controlled appropriately.

(e) According to the present embodiment, by using the TEA gas composed of three elements, i.e., C, N, and H, which is an amine-based gas containing Si but not containing metal, as the second process gas, it is possible to improve reaction controllability, particularly, composition controllability for forming the SiOCN film or the SiOC film. That is, in the film forming sequence of the present embodiment where the TEA gas is used as the second process gas, it is possible to further improve reaction controllability, particularly, composition controllability for forming the first layer by reaction of the second process gas with the Si-containing layer containing Cl as compared to a film forming sequence where a tetrakisethylmethylaminohafnium ($Hf[N(C_2H_5)(CH_3)]_4$, abbreviation: TEMAH) gas composed of hafnium (Hf), C, N, and H is used as the second process gas. As such, the composition control of the SiOCN film or the SiOC film can be facilitated.

(f) According to the present embodiment, by using the TEA gas composed of three elements, i.e., C, N, and H, which is an amine-based gas containing Si but not containing metal, as the second process gas, it is possible to reduce an impurity concentration in the formed SiOCN film or SiOC film. That is, in the film forming sequence of this embodiment where the TEA gas is used as the second process gas, it is possible to reduce a probability of introduction of impurity elements into the first layer formed by reaction of the second process gas with the Si-containing layer containing Cl as compared to a film forming sequence where the TEMAH gas composed of Hf, C, N, and H is used as the second process gas. As such, the reduction of the impurity concentration in the SiOCN film or the SiOC film can be facilitated.

(g) According to the present embodiment, by using the TEA gas composed of three elements, i.e., C, N, and H, which is an amine-based gas containing Si but not containing metal, as the second process gas, it is possible to improve film thickness uniformity in a wafer plane and between wafer planes for the SiOCN film or the SiOC film on the wafer 200. That is, since the TEA gas composed of three elements of C, N, and H has higher reactivity with the Si-containing layer containing Cl than, for example, the TEMAH gas composed of four elements of Hf, C, N, and H, in the film forming sequence of the present embodiment where the TEA gas is used as the second process gas, it is possible to produce reliable and uniform reaction of the second process gas with the Si-containing layer containing Cl in the plane of the wafer 200 and between the planes of the wafers 200. As a result, it is possible to improve the film thickness uniformity in the plane of the wafer 200 and between the planes of the wafers 200 of the SiOCN film or the SiOC film.

(h) According to the present embodiment, after forming the first layer containing Si, N, and C by alternately performing Steps 1 and 2 once, Step 3 is performed to oxidize the first layer using the $O_2$ gas, which is an oxygen-containing gas, as the fourth process gas so as to modify the first layer into the SiOCN layer or the SiOC layer serving as the second layer. Thus, the composition ratio of O, C, and N in the SiOCN film or the SiOC film can be adjusted. In addition, by activating the $O_2$ gas with heat, the thermal oxidation by the $O_2$ gas can increase Si—O bonds in the SiOCN film or SiOC film, while decreasing Si—N bonds, Si—C bonds and Si—Si bonds. As such, it is possible to change the composition ratio in such a manner to increase the O concentration and decrease the N concentration, the C concentration, and the Si concentration. In addition, by extending the thermal oxidation time or increasing the oxidizing power in the thermal oxidation, it is possible to change the composition ratio in such a manner to further increase the O concentration and further decrease the N concentration, the C concentration, and the Si concentration. Further, by controlling the process conditions (i.e., gas supply time, supply flow rate, partial pressure, internal pressure of the process chamber 201, etc.), the ratio of O component, i.e., the O concentration in the SiOCN film or the SiOC film can be finely adjusted so that the composition ratio of the SiOCN film or the SiOC film can be more precisely controlled. Accordingly, it is possible to adjust a dielectric constant of the SiOCN film or the SiOC film and improve etching resistance and leak resistance thereof.

Modifications

Although the foregoing describes that in the above film forming sequence with reference to FIGS. 4 and 5, the process of supplying the hydrocarbon-based gas (e.g., $C_3H_6$ gas) serving as the third process gas and the process of supplying the amine-based gas (e.g., TEA gas) serving as the second process gas are simultaneously performed (i.e., the $C_3H_6$ gas supplying process is performed within at least a period of the TEA gas supplying process but is not performed within a period of halting the TEA gas supplying process), the film forming sequence according to the embodiment is not limited thereto but may be modified as follows.

For example, as described in a first modified example shown in FIG. 5, the $C_3H_6$ gas supplying process in Step 2 may be performed prior to starting the TEA gas supplying process and also concurrently with the TEA gas supplying process. Thus, the $C_3H_6$ gas supplying process in Step 2 may be performed in a period before supplying the TEA gas has begun and in a period of supplying the TEA gas, but not performed in a period after supplying the TEA gas has ended.

In addition, for example, as described in a second modified example shown in FIG. 5, the $C_3H_6$ gas supplying process in Step 2 may be performed concurrently with the TEA gas supplying process and also after ending the TEA gas supplying process. Thus, the $C_3H_6$ gas supplying process in Step 2 may be performed in a period of supplying the TEA gas and in a period after supplying the TEA gas has ended, but not performed in a period before supplying the TEA gas has begun.

In addition, for example, as described in a third modified example shown in FIG. 5, the $C_3H_6$ gas supplying process in Step 2 may be performed prior to starting the TEA gas supplying process, concurrently with the TEA gas supplying process, and after the TEA gas supplying process has ended. Thus, the $C_3H_6$ gas supplying process in Step 2 may be performed in a period before supplying the TEA gas has begun, during a period of supplying the TEA gas, and in a period after supplying the TEA gas has ended.

In addition, for example, as described in a fourth modified example shown in FIG. 5, the $C_3H_6$ gas supplying process in Step 2 may be performed only prior to the TEA gas supplying process, but not performed concurrently with the TEA gas supplying process. Thus, the $C_3H_6$ gas supplying process in Step 2 may be performed only in a period before supplying the TEA gas has begun, but not performed in a period of supplying the TEA gas and in a period after supplying the TEA gas has ended.

In addition, for example, as described in a fifth modified example shown in FIG. 5, the $C_3H_6$ gas supplying process in Step 2 may be performed only after ending the TEA gas supplying process, but not performed concurrently with the TEA gas supplying process. Thus, the $C_3H_6$ gas supplying process in Step 2 may be performed only in a period after supplying the TEA gas has ended, but not performed in a period before supplying the TEA gas has begun and in a period of supplying the TEA gas.

In addition, for example, as described in a sixth modified example shown in FIG. 5, the $C_3H_6$ gas supplying process in Step 2 may be performed prior to starting the TEA gas supplying process and after ending the TEA gas supplying process, but not performed concurrently with the TEA gas supplying process. Thus, the $C_3H_6$ gas supplying process in Step 2 may be performed in a period before the start of supplying the TEA gas and in a period after ending the supply of the TEA gas, but not performed in a period of supplying the TEA gas.

The above modified examples can also achieve the same effects as the film forming sequence described above with reference to FIGS. 4 and 5. That is to say, even when the $C_3H_6$ gas supplying process is performed both in the TEA gas supply period and in the TEA gas supply halt period, or performed in the TEA gas supply halt period without being performed in the TEA gas supply period, it is possible to increase the C concentration in the SiOCN film or the SiOC film. Further, ratios of Si, N, C, and O components in the film can be more finely controlled so as to improve controllability of the composition ratio of the SiOCN film or the SiOC film.

In addition, in the above modified examples, by appropriately controlling the supply conditions for the $C_3H_6$ gas supplying process which is performed in the TEA gas supply period and/or the TEA gas supply halt period (i.e., gas supply time, supply flow rate, internal pressure of the process chamber 201, partial pressure of the $C_3H_6$ gas, etc.), the C concentration in the SiOCN film or the SiOC film can be finely adjusted.

For example, by setting the internal pressure of the process chamber 201 in the process of performing the $C_3H_6$ gas supplying process in the TEA gas supply halt period in Step 2 to be greater than the internal pressure of the process chamber 201 in the TEA gas supplying process (i.e., the TEA gas supply period), it is possible to further increase the C concentration in the SiOCN film or the SiOC film. As such, by setting the internal pressure of the process chamber 201 in the process of performing the $C_3H_6$ gas supplying process prior to starting the TEA gas supplying process to be greater than the internal pressure of the process chamber 201 in the TEA gas supplying process, it is possible to further increase the C concentration in the SiOCN film or the SiOC film. In addition, by setting the internal pressure of the process chamber 201 in the process of performing the $C_3H_6$ gas supplying process after ending the TEA gas supplying process to be greater than the internal pressure of the process chamber 201 in the TEA gas supplying process, it is possible to further increase the C concentration in the SiOCN film or the SiOC film.

In addition, for example, by setting the internal pressure of the process chamber 201 in the process of performing the $C_3H_6$ gas supplying process in the TEA gas supply halt period in Step 2 to be smaller than the internal pressure of the process chamber 201 in the TEA gas supplying process (i.e., the TEA gas supply period), it is possible to appropriately control the amount of increase of the C concentration in the SiOCN film or the SiOC film. Thus, by setting the internal pressure of the process chamber 201 in the process of performing the $C_3H_6$ gas supplying process prior to starting the TEA gas supplying process to be smaller than the internal pressure of the process chamber 201 in the TEA gas supplying process, it is possible to appropriately control the amount of increase of the C concentration in the SiOCN film or the SiOC film. In addition, by setting the internal pressure of the process chamber 201 in the process of performing the $C_3H_6$ gas supplying process after ending the TEA gas supplying process to be smaller than the internal pressure of the process chamber 201 in the TEA gas supplying process, it is possible to appropriately control the amount of increase of the C concentration in the SiOCN film or the SiOC film.

In addition, for example, by extending the gas supply time of the $C_3H_6$ gas or increasing the supply flow rate of the $C_3H_6$ gas during the process of performing the $C_3H_6$ gas supplying process within the TEA gas supply halt period in Step 2, it is possible to even further increase the C concentration in the SiOCN film or the SiOC film.

In contrast, for example, by reducing the gas supply time of the $C_3H_6$ gas or decreasing the supply flow rate of the TEA gas and the $C_3H_6$ gas during the process of performing the $C_3H_6$ gas supplying process within the TEA gas supply halt period in Step 2, it is possible to appropriately control any increase of the C concentration in the SiOCN film or the SiOC film.

In addition, according to the above modified examples, it is possible to increase the C concentration in the SiOCN film or the SiOC film without excessively increasing the internal pressure of the process chamber 201 in the TEA gas supplying process, without excessively extending the TEA gas supply time, and without excessively increasing the TEA gas supply flow rate. That is, by appropriately controlling the supply conditions for the $C_3H_6$ gas supplying process performed within the TEA gas supply halt period (i.e., gas supply time, supply flow rate, internal pressure of the process chamber 201, partial pressure of the $C_3H_6$ gas, etc.) while setting the supply conditions for the TEA gas supplying process (i.e., gas supply time, supply flow rate, internal pressure of the process chamber 201, partial pressure of the TEA gas, etc.) to fall within a proper range, the C concentration in the SiOCN film or the SiOC film can be increased. In addition, it is possible to reduce consumption of the TEA gas which is relatively expensive, which can result in a reduction in substrate processing costs.

Second Embodiment

A second embodiment is described below.

Although the first embodiment describes that the oxidizing gas (e.g., $O_2$ gas) is used as the fourth process gas, and the silicon oxycarbonitride film or the silicon oxycarbide film having a predetermined composition and a predetermined film thickness is formed on the wafer 200, it will be illustrated in the second embodiment that the nitriding gas (e.g., $NH_3$ gas) is used as the fourth process gas and a silicon carbonitride film having a predetermined composition and a predetermined film thickness is formed on the wafer 200.

In this embodiment, an example is described in which a silicon carbonitride (SiCN) film (i.e., a film containing at least a predetermined element and carbon) having a predetermined composition and a predetermined film thickness is formed on the wafer 200 by performing a cycle a plurality of times (e.g., n times), the cycle including supplying to the wafer 200 HCDS gas (i.e., a chlorosilane-based precursor gas) as a first process gas; supplying to the wafer 200 TEA gas (i.e., an amine-based gas) as a second process gas; supplying to the wafer 200 $C_3H_6$ gas (i.e., a hydrocarbon-based gas) as a third process gas; and supplying to the wafer 200 $NH_3$ gas (i.e., a nitriding gas) as a fourth process gas. Here, an example of performing the $C_3H_6$ gas supplying process concurrently with performing the TEA gas supplying process, that is, an example where the $C_3H_6$ gas supplying process is performed in a period of supplying the TEA gas but not performed in a period of halting supply of the TEA gas, will be described.

This embodiment has the same configurations as the first embodiment except that thermally activated $NH_3$ gas is used as the fourth process gas in Step 3. Step 3 in this embodiment is described below.
[Step 3]
($NH_3$ Gas Supply)

After Step 2 is completed by removing the residual gas from the process chamber 201, the valve 243e of the fifth gas supply pipe 232e is opened to flow the $NH_3$ gas into the fifth gas supply pipe 232e. A flow rate of the $NH_3$ gas flowing in the fifth gas supply pipe 232e is adjusted by the MFC 241e. The flow rate-adjusted $NH_3$ gas is flown into the third gas supply pipe 232c and is supplied from the gas supply holes 250c of the third nozzle 249c into the process chamber 201. The $NH_3$ gas supplied into the process chamber 201 is activated (or excited) by heat and is exhausted through the exhaust pipe 231. As such, the $NH_3$ gas activated by heat is supplied onto the wafer 200. In this case, the valve 243h is opened to flow the $N_2$ gas into the third inert gas supply pipe 232h. The $N_2$ gas is supplied into the process chamber 201, together with the $NH_3$ gas, and is exhausted through the exhaust pipe 231.

During this operation, the valves 243f and 243g are opened to allow the $N_2$ gas to flow into the first inert gas supply pipe 232f and the second inert gas supply pipe 232g in order to prevent the infiltration of the $NH_3$ gas into the first nozzle 249a and the second nozzle 249b. The $N_2$ gas is supplied into the process chamber 201 through the first gas supply pipe 232a, the second gas supply pipe 232b, the first nozzle 249a, and the second nozzle 249b and is exhausted through the exhaust pipe 231.

In this case, the APC valve 244 is appropriately adjusted such that the internal pressure of the process chamber 201 falls within a range of, for example, 1 to 3,000 Pa. The internal pressure of the process chamber 201 is set to fall within such a relatively high pressure range so as to allow the $NH_3$ gas to be thermally activated under non-plasma conditions. In addition, when the $NH_3$ gas is thermally activated and supplied, it is possible to generate a relative soft reaction so as to perform the nitridation more softly, which will be described later. The supply flow rate of the $NH_3$ gas controlled by the MFC 241e is set to fall within a range of, for example, 100 to 10,000 sccm. The supply flow rate of the $N_2$ gas controlled by each of the MFCs 241h, 241f, and 241g is set to fall within a range of, for example, 100 to 10,000 sccm. Further, the partial pressure of the $NH_3$ gas in the process chamber 201 is set to fall within a range of 0.01 to 2,970 Pa. The time period for which the thermally activated $NH_3$ gas is supplied onto the wafers 200, in other words, a gas supply time (i.e., an irradiation time), is set to fall within a range of, for example, 1 to 120 seconds, specifically, 1 to 60 seconds. In this case, the temperature of the heater 207 is set such that the temperature of the wafers 200 falls within a range of, for example, 250 to 700 degrees C., specifically, 300 to 650 degrees C., more specifically, 350 to 600 degrees C., in the same manner as described with respect to Steps 1 and 2.

Here, the $NH_3$ gas which thermally activated by the high internal pressure of the process chamber 201 is flown into the process chamber 201 and none of the HCDS gas, the TEA gas, and the $C_3H_6$ gas is flown into the process chamber 201. Therefore, the thermally activated $NH_3$ gas reacts with at least a portion of the first layer containing Si, N, and C formed on the wafer 200 in Step 2, without causing any gaseous reaction. This reaction nitrides the first layer to be modified into a layer containing Si, C, and N (e.g., a silicon carbonitride (SiCN) layer) serving as the second layer.

When the thermally activated $NH_3$ gas flows into the process chamber 201, the first layer can be thermally nitrided to be modified (or changed) into the SiCN layer. Here, increase of the N component in the first layer modifies the first layer into the SiCN layer. In this case, the thermal nitridation by the $NH_3$ gas increases Si—N bonds in the first layer, while decreasing Si—C bonds and Si—Si bonds, so that ratios of C and Si components in the first layer are reduced. Thus, the first layer can be modified into the SiCN layer while changing the composition ratio in such a manner that the N concentration is increased whereas the C and the Si concentrations are decreased. As such, by controlling process conditions such as the gas supply time, the supply flow rate, the partial pressure, the internal pressure of the process chamber 201, and so on, the ratio of N component in the SiCN layer, that is to say, the N concentration, can be finely adjusted and the composition ratio of the SiCN layer can be more precisely controlled.

Here, the nitridation reaction of the first layer may be not saturated. For example, when the first layer having a thickness from less than one atom layer to several atomic layers is formed in Steps 1 and 2, a portion of the first layer may be nitrided. In this case, the nitridation is performed in such a manner that the oxidation reaction of the first layer is unsaturated in order to prevent the entire first layer having the thickness from less than one atom layer to several atomic layers from being nitrided.

Although the unsaturation of the nitridation reaction of the first layer may be achieved under the above process conditions employed in Step 3, it can be more easily achieved by changing the process conditions of Step 3 to the following process conditions:

Wafer temperature: 500 to 650 degrees C.
Internal pressure of process chamber: 133 to 2,666 Pa
$NH_3$ gas partial pressure: 33 to 2,515 Pa
Flow rate of supplied $NH_3$ gas: 1,000 to 5,000 sccm
Flow rate of supplied $N_2$ gas: 300 to 3,000 sccm
$NH_3$ gas supply time: 6 to 60 seconds.

(Residual Gas Removal)

After the second layer is formed, the valve 243e of the fifth gas supply pipe 232e is closed to stop the supply of the $NH_3$ gas. At this time, while the APC valve 244 of the exhaust pipe 231 is in an open state, the interior of the process chamber 201 is vacuum-exhausted by the vacuum pump 246 to remove from the process chamber 201 the $NH_3$ gas, which has not reacted or remains after contributing to the formation of the second layer, and reaction byproducts remaining in the process chamber 201. In this operation, the supply of the $N_2$ gas into the process chamber 201 is maintained by keeping the valves 243h, 243f, and 243g in an open state. The $N_2$ gas acts as a purge gas so as to enhance the effect of removing from the process chamber 201 the $NH_3$ gas, which has not reacted or remains after contributing to the formation of the second layer, and reaction byproducts remaining in the process chamber 201.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 1. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 1. As described above, as the interior of the process chamber 201 is purged incompletely, the purge time can be reduced and the throughput can be improved. In addition, the consumption of the $N_2$ gas can also be suppressed to a minimal necessity.

Examples of the nitrogen-containing gas may contain diazene ($N_2H_2$) gas, hydrazine ($N_2H_4$) gas, $N_3H_8$ gas, a gas containing compounds thereof and the like, in addition to the $NH_3$ gas. Examples of the inert gas may include rare gases such as Ar gas, He gas, Ne gas, Xe gas and the like, in addition to the $N_2$ gas.

(Performing Predetermined Number of Times)

When one cycle including Steps 1 to 3 is performed one or more times (e.g., a predetermined number of times), a film containing Si, C, and N (e.g., a silicon carbonitride (SiCN) film) having a predetermined composition and film thickness can be formed on the wafer 200. This cycle may be repeated a plurality of times. Thus, a thickness of the SiCN layer formed per cycle may be set to be smaller than a desired film thickness and the cycle is repeated a plurality of times until the desired film thickness is obtained.

According to the present embodiment, after forming the first layer containing Si, N, and C by alternately performing Steps 1 and 2 once, Step 3 is performed to nitride the first layer using the $NH_3$ gas, which is a nitrogen-containing gas, as the fourth process gas so as to modify the first layer into the SiCN layer serving as the second layer. Thus, the composition ratio of C and N in the formed SiCN film can be adjusted. In addition, by activating the $NH_3$ gas with heat, the thermal nitridation by the $NH_3$ gas can increase Si—N bonds in the SiCN film, while decreasing Si—C bonds and Si—Si bonds. As such, it is possible to change the composition ratio in such a manner to increase the N concentration and decrease the C concentration and the Si concentration. In addition, by extending the thermal nitridation time or increasing the nitriding power in the thermal nitridation, it is possible to change the composition ratio in such a manner to further increase the N concentration and further decrease the C concentration and the Si concentration. Further, by controlling the process conditions (i.e., gas supply time, flow rate, partial pressure, internal pressure of the process chamber 201, etc.), the ratio of N component, i.e., the N concentration in the SiCN film can be finely adjusted so that the composition ratio of the SiCN film can be more precisely controlled. Accordingly, it is possible to adjust a dielectric constant of the SiCN film and improve etching resistance and leak resistance thereof.

In addition, this embodiment achieves the same effects as the above first embodiment. Specifically, by performing the hydrocarbon-based gas (e.g., $C_3H_6$ gas) supplying process in at least the amine-based gas (e.g., TEA gas) supplying period, it is possible to increase the C concentration in the SiCN film. In addition, by appropriately controlling the internal pressure when the TEA gas and the $C_3H_6$ gas are supplied, it is possible to finely adjust the C concentration in the SiCN film. In addition, by using the TEA gas as the second process gas which is a Si-containing gas but metal-free amine-based gas composed of three elements, i.e., C, N, and H and having more C atoms than N atoms in its composition formula, it is possible to increase the C concentration in the SiCN film, improve reaction controllability, particularly, composition controllability, in forming the SiCN film, reduce an impurity concentration in the film and improve film thickness uniformity in the plane of the wafer 200 and between the planes of the wafers 200 of the film.

Modifications

In the second embodiment, the $C_3H_6$ gas supplying process can be modified as described with reference to the first to sixth modified examples of the first embodiment shown in FIG. 5. As such, the $C_3H_6$ gas supplying process can be performed not only in the TEA gas supply period but also in the TEA gas supply halt period. The $C_3H_6$ gas supplying process can also be performed in the TEA gas supply halt period without being performed in the TEA gas supply period.

Even in those cases, like the above first embodiment, it is possible to increase the C concentration in the SiCN film. Further, the ratios of Si, N, and C components in the film can be more closely controlled, thereby improving controllability of the composition ratio of the SiCN film. In addition, by appropriately controlling the supply conditions for the $C_3H_6$ gas supplying process (i.e., gas supply time, flow rate, internal pressure of the process chamber 201, partial pressure of the $C_3H_6$ gas, etc.) performed in the TEA gas supply period and/or in the TEA gas supply halt period, the C concentration in the SiCN film can be finely adjusted.

Other Embodiments

Although various embodiments have been described in the above, the present disclosure is not limited to these disclosed embodiments and various modifications and changes may be made without departing from the spirit and scope of the present disclosure.

For example, although an example of performing the $C_3H_6$ gas supplying process in the TEA gas supply period and/or in the TEA gas supply halt period is illustrated in the above embodiments, the present disclosure is not limited to these embodiments.

For example, as shown in FIG. 13, the $C_3H_6$ gas supplying process may be performed concurrently with the HCDS gas supplying process. In addition, as described in the first to sixth modified examples of FIG. 13, the $C_3H_6$ gas supplying process may be performed not only both in the HCDS gas supply halt period and in the HCDS gas supply period, but also in the HCDS gas supply halt period without being performed in the HCDS gas supply period. In addition, for example, as shown in FIG. 14, the $C_3H_6$ gas supplying process may be performed concurrently with the $O_2$ gas supplying process. In addition, as illustrated in the first to sixth modified examples of FIG. 14, the $C_3H_6$ gas supplying process may be performed not only both in the $O_2$ gas supply halt period and in the $O_2$ gas supply period, but also in the $O_2$ gas supply halt period without being performed in the $O_2$ gas supply period.

Even in those cases, it is possible to increase the C concentration in the SiOCN film or the SiOC film, thereby improving controllability of the composition ratio of the SiOCN film or the SiOC film.

In addition, for example, although the above embodiments illustrate that the first layer containing Si, N, and C is formed by supplying the chlorosilane-based precursor gas to the wafers 200 and then supplying the amine-based gas and the hydrocarbon-based gas to the wafers 200, the supply order of these gases may be reversed. Accordingly, the amine-based gas and the hydrocarbon-based gas may be first supplied and the chlorosilane-based precursor gas may then be supplied. That is, either the chlorosilane-based precursor gas or the amine-based and the hydrocarbon-based gases may be first supplied and the other may then be supplied. By reversing the supply order of the gases in the above manner, it is possible to change the film quality and the composition ratio of the formed thin film.

In addition, for example, although the above embodiments illustrate that the chlorosilane-based precursor gas is used as the first process gas (i.e., precursor gas) to form the initial layer containing a predetermined element (i.e., Si) and the halogen element (CO in Step 1, the chlorosilane-based precursor gas may be replaced with a silane-based precursor gas having halogen-based ligands other than chloro groups. For example, the chlorosilane-based precursor gas may be replaced with a fluorosilane-based precursor gas. As used herein, the fluorosilane-based precursor gas refers to a fluorosilane-based precursor gas in a gaseous state, for example, a gas which is obtained by vaporizing a fluorosilane-based precursor in a liquid state under the normal temperature and pressure, a fluorosilane-based precursor which is in a gas state under normal temperature and pressure, and the like. In addition, the fluorosilane-based precursor refers to a silane-based precursor having a fluoro group as a halogen group and also refers to a precursor containing at least silicon (Si) and fluorine (F). As such, the fluorosilane-based precursor may refer to a kind of halide. Examples of the fluorosilane-based precursor gas may include silicon fluoride gases such as tetrafluorosilane (i.e., silicon tetrafluoride ($SiF_4$)) gas, hexafluorodisilane ($Si_2F_6$) gas, and the like. In this case, the fluorosilane-based precursor gas is supplied to the wafers 200 in the process chamber 201 to form the initial layer containing a predetermined element and a halogen element. In this case, the initial layer formed as a layer containing Si and F, i.e., a F and Si-containing layer.

In addition, the above embodiments illustrate that the amine-based gas is used as the second process gas to change (or modify) the Si-containing layer containing Cl which serves as the initial layer into the first layer containing Si, N, and C, the amine-based gas may be replaced with, for example, an organic hydrazine compound-containing gas, i.e., an organic hydrazine-based gas, as the second process gas. The organic hydrazine compound-containing gas may be simply referred to as an organic hydrazine compound gas or an organic hydrazine gas. Here, the organic hydrazine-based gas refers to an organic hydrazine gas, for example, a gas which is obtained by vaporizing organic hydrazine in a liquid state under normal temperature and pressure, a gas including hydrazine groups such as organic hydrazine which is in a gas state under normal temperature and pressure, and the like. The organic hydrazine-based gas is a silicon (Si)-free gas composed of three elements, i.e., carbon (C), nitrogen (N), and hydrogen (H), and further a Si-free and metal-free gas. Examples of the organic hydrazine-based gas may include methylhydrazine-based gases such as monomethylhydrazine ($(CH_3)HN_2H_2$, abbreviation: MMH) gas, dimethylhydrazine ($(CH_3)_2N_2H_2$, abbreviation: DMH) gas, trimethylhydrazine ($(CH_3)_2N_2(CH_3)H$, abbreviation: TMH) gas and the like; ethylhydrazine-based gases such as ethylhydrazine ($(C_2H_5)HN_2H_2$, abbreviation: EH) gas and the like, etc. In this case, the organic hydrazine-based gas and the hydrocarbon-based gas are supplied to the wafers 200 to change (or modify) the Si-containing layer containing Cl which serves as the initial layer into the first layer containing Si, N, and C. A gas composed of three elements, i.e., C, N, and H and having more C atoms than N atoms in its composition formula (e.g., in one molecule) may be used as the organic hydrazine-based gas. In addition, a gas having a plurality of ligands containing C atoms in its composition formula (e.g., in one molecule), i.e., a gas having a plurality of hydrocarbon groups such as alkyl groups in its composition formula (e.g., in one molecule), may be used as the organic hydrazine-based gas. More specifically, a gas having two or three ligands (e.g., hydrocarbon groups such as alkyl groups) including C atoms in its composition formula (e.g., in one molecule) may be used as the organic hydrazine-based gas.

In addition, although the above embodiments illustrate that the first layer containing Si, N, and C is formed by supplying the chlorosilane-based precursor gas to the wafer 200s and then supplying the amine-based gas and the hydrocarbon-based gas to the wafers 200, the chlorosilane-based precursor gas and the amine-based and the hydrocarbon-based gases may be simultaneously supplied to the wafers 200 to produce a CVD reaction. Such simultaneous supply instead of the sequential supply of the chlorosilane-based precursor gas and the amine-based and the hydrocarbon-based gases can provide the same operation and effects as the above embodiments. However, the chlorosilane-based precursor gas and the amine-based and the hydrocarbon-based gases may be supplied alternately with a purge in the process chamber 201 put therebetween, as in the above-described embodiment, in that the chlorosilane-based precursor gas and the amine-based gas can properly react with each other under a condition where a surface reaction is dominant, thereby improving controllability of film thickness.

In addition, although the above embodiments illustrate that the SiCN film is formed on the wafer 200 by performing a predetermined number of times the cycle including the HCDS gas supplying process, the TEA gas supplying process, the $C_3H_6$ gas supplying process, and the $NH_3$ gas supplying process, the present disclosure is not limited thereto. For example, the SiCN film may be formed on the wafer 200 by performing a predetermined number of times a cycle including the HCDS gas supplying process, the TEA gas supplying process, and the $C_3H_6$ gas supplying process, without the $NH_3$ gas supplying process.

In addition, although the above embodiments illustrate that the $C_3H_6$ gas serving as the hydrocarbon-based gas is used as the third process gas, $NH_3$ gas serving as a nitrogen-containing gas or the like may be used as the third process gas, in which the N concentration in the formed film can be easily increased.

When the silicon-based insulating films formed according to the methods of the above embodiments and modifications are used as a sidewall spacer, it is possible to provide device forming techniques with a small leak current and excellent workability.

In addition, when the silicon-based insulating films formed according to the methods of the above embodiments and modifications are used as an etching stopper, it is possible to provide device forming techniques with excellent workability.

According to the above embodiments and modifications, it is possible to form a silicon-based insulating film having an ideal stoichiometry without using plasma even in a low temperature region. In addition, since the silicon-based insulating film can be formed without using plasma, the above embodiments and modifications may be applied to processes which are prone to plasma damage, such as, for example, forming a SADP film of DPT.

In addition, although the above embodiments illustrate that the silicon-based insulating films (i.e., the SiOCN film, the SiOC film, and the SiCN film) containing Si serving as a semiconductor element are formed as an oxycarbonitride film, an oxycarbide film, and a carbonitride film, respectively, the present disclosure may be applied to a case where a metal-based film containing metal elements such as titanium (Ti), zirconium (Zr), hafnium (Hf), tantalum (Ta), aluminum (Al), molybdenum (Mo), and the like is formed.

For example, the present disclosure may be appropriately applied to a case where a metal-oxycarbonitride film such as a titanium-oxycarbonitride film (TiOCN film), a zirconium-oxycarbonitride film (ZrOCN film), a hafnium-oxycarbonitride film (HfOCN film), a tantalum-oxycarbonitride film (TaOCN film), an aluminum-oxycarbonitride film (AlOCN film), a molybdenum-oxycarbonitride film (MoOCN film), or the like is formed.

In addition, for example, the present disclosure may be appropriately applied to a case where a metal-oxycarbide film such as a titanium-oxycarbide film (TiOC film), a zirconium-oxycarbide film (ZrOC film), a hafnium-oxycarbide film (HfOC film), a tantalum-oxycarbide film (TaOC film), an aluminum-oxycarbide film (AlOC film), a molybdenum-oxycarbide film (MoOC film), or the like is formed.

In addition, for example, the present disclosure may be appropriately applied to a case where a metal-carbonitride film such as a titanium-carbonitride film (TiCN film), a zirconium-carbonitride film (ZrCN film), a hafnium-carbonitride film (HfCN film), a tantalum-carbonitride film (TaCN film), an aluminum-carbonitride film (AlCN film), a molybdenum-carbonitride film (MoCN film) or the like is formed.

In this case, instead of the chlorosilane-based precursor gas used in the above embodiments, a precursor gas containing a metal element and a halogen element may be used to form a film under the same sequence as the above embodiments. In other words, a film containing at least a metal element and carbon is formed as a metal-based film on the wafer 200 by performing a cycle a predetermined number of times (or one or more times), the cycle including supplying to the wafer 200 a first process gas containing a metal element and a halogen element; supplying to the wafer 200a second process gas including carbon and nitrogen; supplying to the wafer 200a third process gas containing carbon; and supplying to the wafer 200 a fourth process gas different from each of the first to the third process gases.

For example, when the metal-based films containing Ti (the TiOCN film, the TiOC film, and the TiCN film) are formed, the first process gas used may be a precursor gas containing Ti and chloro groups, such as a titanium tetrachloride ($TiCl_4$) or the like, or a precursor gas containing Ti and fluoro groups, such as a titanium tetrafluoride ($TiF_4$) or the like. In this case, the second to fourth process gases used may be the same as in the above embodiments. In addition, the same process conditions as in the above embodiments may be used.

In addition, for example, when the metal-based films containing Zr (the ZrOCN film, the ZrOC film and the ZrCN film) are formed, the first process gas used may be a precursor gas containing Zr and chloro groups, such as a zirconium tetrachloride ($ZrCl_4$) or the like, or a precursor gas containing Zr and fluoro groups, such as a zirconium tetrafluoride ($ZrF_4$) or the like. In this case, the second to fourth process gases used may be the same as in the above embodiments. In addition, the same process conditions as in the above embodiments may be used.

In addition, for example, when the metal-based films containing Hf (the HfOCN film, the HfOC film and the HfCN film) are formed, the first process gas used may be a precursor gas containing Hf and chloro groups, such as a hafnium tetrachloride ($HfCl_4$) or the like, or a precursor gas containing Hf and fluoro groups, such as a hafnium tetrafluoride ($HfF_4$) or the like. In this case, the second to fourth process gases used may be the same as in the above embodiments. In addition, the same process conditions as in the above embodiments may be used.

In addition, for example, when the metal-based films containing Ta are (the TaOCN film, the TaOC film and the TaCN film) formed, the first process gas used may be a precursor gas containing Ta and chloro groups, such as a tantalum pentachloride ($TaCl_5$) or the like, or a precursor gas containing Ta and fluoro groups, such as a tantalum pentafluoride ($TaF_5$) or the like. In this case, the second to fourth process gases used may be the same as in the above embodiments. In addition, the same process conditions as in the above embodiments may be used.

In addition, for example, when the metal-based films containing Al (the AlOCN film, the AlOC film and the AlCN film) are formed, the first process gas used may be a precursor gas containing Al and chloro groups, such as an aluminum trichloride ($AlCl_3$) or the like, or a precursor gas containing Al and fluoro groups, such as an aluminum trifluoride ($AlF_3$) or the like. In this case, the second to fourth process gases used may be the same as in the above embodiments. In addition, the same process conditions as in the above embodiments may be used.

In addition, for example, when the metal-based films containing Mo are (the MoOCN film, the MoOC film and the MoCN film) formed, the first process gas used may be a precursor gas containing Mo and chloro groups, such as a molybdenum pentachloride ($MoCl_5$) or the like, or a precursor gas containing Mo and fluoro groups, such as a molybdenum pentafluoride ($MoF_5$) or the like. In this case, the second to fourth process gases used may be the same as in the above embodiments. In addition, the same process conditions as in the above embodiments may be used.

In brief, the present disclosure may be appropriately applied to a case where films containing predetermined elements such as semiconductor elements, metal elements, and the like are formed.

In addition, a plurality of process recipes (e.g., programs describing process procedures and process conditions) used to form these various kinds of films may be individually prepared according to contents (e.g., kind, composition ratio, quality, thickness of films to be formed) of substrate processing. In addition, at the start of the substrate processing, an appropriate one of the plurality of process recipes may be selected according to the substrate processing contents. Specifically, the plurality of process recipes individually prepared according to the substrate processing contents may be stored (or installed) in the memory device 121c of the substrate processing via a telecommunication line or a recording medium (e.g., the external memory device 123) storing the process recipes. In addition, at the start of the substrate processing, the CPU 121a of the substrate processing apparatus may select an appropriate one of the plurality of process recipes stored in the memory device 121c, according to the substrate processing contents. This configuration allows a single substrate processing apparatus to form films having different kinds, composition ratios, qualities and thicknesses for general purposes and with high reproducibility. In addition, this configuration can reduce an operator's operation burden (a burden on input of process procedures and process conditions), thereby avoiding an operation error and starting the substrate processing quickly.

However, the above-mentioned process recipes may be prepared, for example, by modifying existing process recipes already installed in the substrate processing apparatus, without being limited to newly prepared ones. When the process recipes are modified, the modified process recipes may be installed in the substrate processing apparatus via a telecommunication line or a recording medium storing the process recipes. In addition, the existing process recipes already installed in the substrate processing apparatus may be directly modified by operating the input/output device 122 of the substrate processing apparatus.

In addition, although the above embodiments illustrate that the batch type substrate processing apparatus to process a plurality of substrates at once is used to form the films, the present disclosure is not limited thereto but may be appropriately applied to film formation using a single wafer type substrate processing apparatus to process a single substrate or several substrates at once. In addition, although the above embodiments illustrate that the substrate processing apparatus including the hot wall type processing furnace is used to form the films, the present disclosure is not limited thereto but may be appropriately applied to a case where a substrate processing apparatus including a cold wall type processing furnace is used to form the films.

In addition, the above embodiments, modifications, and applications may be used in proper combinations.

IMPLEMENTATION EXAMPLES

First Implementation Example

As a first implementation example, the substrate processing apparatus and the film forming sequence according to the first embodiment are employed to form SiOC films on a plurality of wafers. HCDS gas, TEA gas, $C_3H_6$, gas, and $O_2$ gas are used as a precursor gas, a second process gas, a third process gas, and a fourth process gas, respectively.

In Step 2, the $C_3H_6$ gas is supplied according to the gas supply timing shown in the third modified example of FIG. 5. Specifically, the $C_3H_6$ gas supplying process is performed in a period before starting supply of the TEA gas (i.e., supply halt period), in a period of supplying the TEA gas supply, and in a period after ending supply of the TEA gas (i.e., supply halt period).

In addition, in Step 2, the internal pressure $P_{2a}$ [Pa] of the process chamber during the process of performing the $C_3H_6$ gas supplying process within the TEA gas supply halt period is set to be greater than the internal pressure $P_{2b}$ [Pa] of the process chamber during the process of supplying to the wafers the TEA gas together with the $C_3H_6$ gas (i.e., the TEA gas supply period) ($P_{2a}>P_{2b}$). In addition, the gas supply time $T_{2a}$ [sec] for the process of performing the $C_3H_6$ gas supplying process within the TEA gas supply halt period is set to be longer than the gas supply time $T_{2b}$ [sec] for the process of supplying to the wafers the TEA gas together with the $C_3H_6$ gas (i.e., the TEA gas supply period). Further, the $C_3H_6$ gas supply flow rate $F_{2a}$ [slm] during the process of performing the $C_3H_6$ gas supplying process within the TEA gas supply halt period is set to be greater than the $C_3H_6$ gas supply flow rate $F_{2b}$ [slm] during the process of supplying to the wafers the TEA gas together with the $C_3H_6$ gas. Furthermore, the TEA gas supply flow rate during the process of supplying to the wafers the TEA gas together with the $C_3H_6$ gas is set to be equal to the $C_3H_6$ gas supply flow rate $F_{2b}$ [slm] in the same process.

In addition, the internal pressure $P_{2a}$ [Pa] of the process chamber during the process of performing the $C_3H_6$ gas supplying process within the TEA gas supply halt period in Step 2 is set to be greater than the internal pressure $P_1$ [Pa] of the process chamber in Step 1 and the internal pressure $P_3$ [Pa] of the process chamber in Step 3 ($P_{2a}>P_1$ and $P_{2a}>P_3$). Further, the internal pressure $P_{2b}$ [Pa] of the process chamber during the process of supplying to the wafers the TEA gas together with the $C_3H_6$ gas (i.e., TEA gas supply period) is set to be greater than the internal pressure $P_1$ [Pa] of the process chamber in Step 1 ($P_{2b}>P_1$). Furthermore, the internal pressure $P_3$ [Pa] of the process chamber in Step 3 is set to be greater than the internal pressure $P_1$ [Pa] of the process chamber in Step 1 ($P_3>P_1$).

In addition, the temperature of the wafers for film formation is set to be in a range from 600 to 650 degrees C. Other process conditions are set to predetermined values within the range of process conditions described with respect to the first embodiment.

Then, film thickness uniformity in a plane of a wafer (hereinafter, which may be referred to as "WiW"), film thickness uniformity between planes of wafers (hereinafter, which may be referred to as "WtW"), and a refractive index (hereinafter, which may be referred to as "R.I.") of the SiOC film according to this example are measured. FIG. 6 illustrates measurement results on the WiW, the WtW, and the R.I. of the SiOC film according to this example. In FIG. 6. "Top" shows a measurement result on wafers installed in a top portion of the boat, "Center" shows a measurement result on wafers installed in a center portion of the boat, and "Bottom" shows a measurement result on wafers installed in a bottom portion of the boat.

As shown in FIG. 6, an average film thickness of the SiOC film according to this example is 170.4 Å for the top wafer, 167.8 Å for the center wafers, and 176.5 Å for the bottom wafers. The WiW is ±2.7% for the top wafers, ±3.6% for the center wafers, and ±4.3% for the lower wafers. In this example, the WtW of the SiOC film is ±2.4%. As such, the SiOC film according to this example achieves good film thickness uniformity in a wafer plane and good film thickness uniformity between wafer planes. It is also confirmed that the R.I. of the SiOC film according to this example is 1.575 in average, which is a reasonable value.

Second Implementation Example

As a second implementation example, the substrate processing apparatus and the film forming sequence according to the first embodiment are used to form SiOC films on a plurality of wafers. Process procedures and process conditions for the film formation are set to be equal to those in the first implementation example. Wafers used are silicon substrates having a plurality of grooves formed thereon, each having an aspect ratio of about 11 (2.8 μm in depth to 0.25 μm in width).

Figure 7:
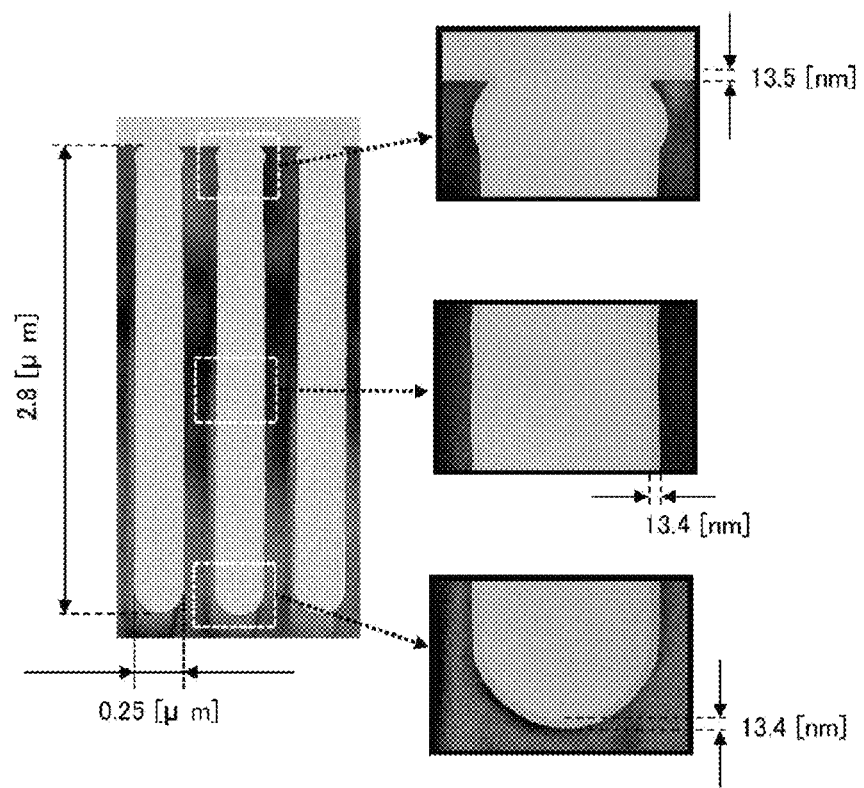
FIG. 7 illustrates measurement results on film thickness and step coverage in lower portions, sidewalls, and outside portions of grooves in a SiOC film according to a second implementation example of the present disclosure.

In this example, film thickness and step coverage in lower portions, sidewalls, and outside portions of the grooves in the SiOC film are measured. FIG. 7 illustrates measurement results on the film thickness and the step coverage in the lower portions, the sidewalls, and the outside portions of the grooves in the SiOC film according to this example, showing a sectional structure of a wafer surface which is taken by electronic microscope after the SiOC film is formed.

FIG. 7 shows that surfaces (specifically, base layers) in the lower portions, the sidewalls, and the outside portions in the grooves formed in the wafer surface are covered by the SiOC film formed according to this example, without a break. FIG. 7 also shows that the film thickness of the SiOC film according to this example is 13.4 nm for the lower portions and the sidewalls of the grooves and 13.5 nm for the outside portions of the grooves, and the step coverage is 99% or more. Thus, as can be confirmed from FIG. 7, the SiOC film according to this example has excellent step coverage.

Third Implementation Example

As a third implementation example, the substrate processing apparatus and the film forming sequence according to the first embodiment are used to form SiOC films on a plurality of wafers. Process procedures and process conditions for film formation are set to be equal to those in the first implementation example.

As a first reference example, the substrate processing apparatus according to the first embodiment and a film forming sequence of performing a cycle a plurality of times, the cycle including supplying HCDS gas to wafers, supplying TEA gas to the wafers, and supplying $O_2$ gas to the wafers, which are performed in that order, are employed to form SiOCN films on a plurality of wafers. For the first reference example, $C_3H_6$ gas is not supplied to the wafers. The temperature of the wafers for film formation is set to be in a range from 600 to 650 degrees C. Other process conditions are set to be predetermined values within the range of process conditions described with reference to the first embodiment.

As a second reference example, the substrate processing apparatus according to the first embodiment and a film forming sequence of performing a cycle a plurality of times, the cycle including supplying HCDS gas to wafers, supplying TEA gas to the wafers, and supplying $O_2$ gas to the wafers, which are performed in that order, are employed to form SiOC films on a plurality of wafers. For the second reference example, the $O_2$ gas is supplied to the wafers for a longer time than that in the first reference example. In addition, for the second reference example, $C_3H_6$ gas is not supplied to the wafers. The temperature of the wafers for film formation is set to be in a range from 600 to 650 degrees C. Other process conditions are set to predetermined values within the range of process conditions described with reference in the first embodiment.

As a comparative example, the substrate processing apparatus according to the first embodiment and a film forming sequence of performing a cycle a plurality of times, the cycle including supplying HCDS gas to wafers and supplying $NH_3$ gas to the wafer, which are performed in that order, are employed to form SiN films on a plurality of wafers. In the comparative example, none of TEA gas, $C_3H_6$ gas, and $O_2$ gas is supplied to the wafers. The temperature of the wafers for film formation is set to be in a range from 600 to 650 degrees C. Other process conditions were set to predetermined values within the range of process conditions described with reference to the first embodiment.

A dielectric constant (or a k-value), a refractive index (R.I.), a resistance to hydrogen fluoride (HF), a resistance to hot phosphoric acid, an XPS composition, and an XRF composition for each of the formed SiOC films are measured. The measurement results are shown in FIGS. 8 to 12.

Figure 8:
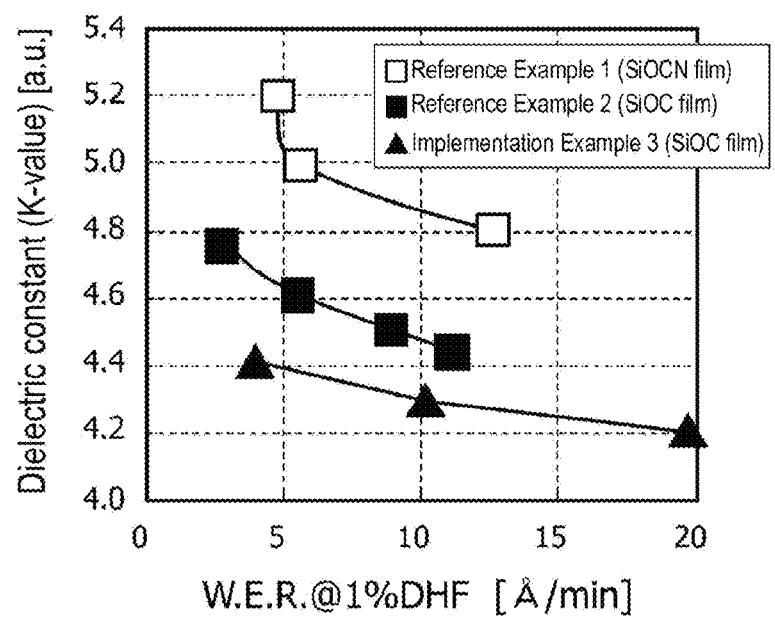
FIG. 8 illustrates measurement results on a relative dielectric constant and a resistance to HF of a SiOC film according to a third implementation example of the present disclosure.

FIG. 8 illustrates measurement results on the dielectric constant and the resistance to HF of the SiOC film according to the third implementation example. In FIG. 8, a horizontal axis represents a wet etching rate (WER) [Å/min] when a film is etched by a 1% HF-containing solution, i.e., a resistance to HF of the film, and a vertical axis represents a dielectric constant [a.u.]. In FIG. 8, triangle symbols (▲) represent measurement results on the SiOC film according to the third implementation example, white square symbols (□) represent measurement results on the SiOCN film according to the first reference example, and black square symbols (■) represent measurement results on the SiOC film according to the second reference example. FIG. 8 shows that for the dielectric constants of the films in a same or similar level, the WER of the SiOC film in the third implementation example is smaller than those of the SiOCN film in the first reference example and the SiOC film in the second reference example. As such, FIG. 8 shows that for the dielectric constants of the films in a same or similar level, the resistance to HF of the SiOC film in the third implementation example is greater than those of the SiOCN film in the first reference example and the SiOC film in the second reference example. Thus, the C concentration of the SiOC film in the third implementation example, which is greater than those of the SiOCN film in the first reference example and the SiOC film in the second reference example, is deemed as the reason for the above.

Figure 9:
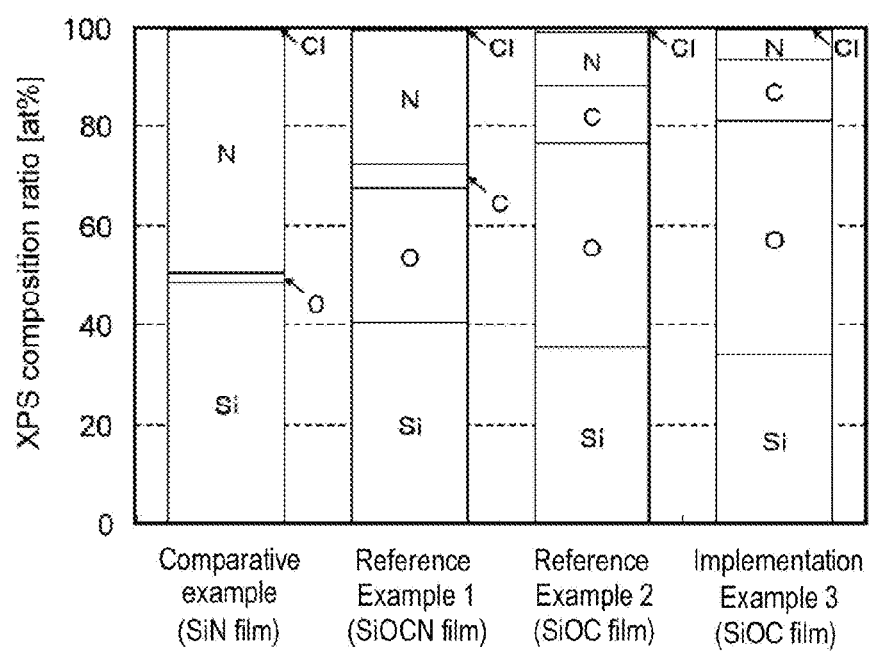
FIG. 9 illustrates results of XPS (X-ray Photoelectron Spectroscopy) measurement on the SiOC film according to the third implementation example of the present disclosure.

FIG. 9 illustrates results of XPS measurements on the SiOC film according to the third implementation example. In FIG. 9, a horizontal axis represents films according to the comparative example, the first reference example, the second reference example, and the third implementation example, and a vertical axis represents Si, O, C, N, and Cl concentrations [at %] in the films measured under XPS. FIG. 9 shows that the C concentration of the SiOC film in the third implementation is greater than those of the SiOCN film in the first reference example, the SiOC film in the reference example, and the SiN film in the comparative example. In addition, FIG. 9 shows that the N concentration of the SiOC film in the third implementation example is smaller (i.e., is lowered to a level of impurity) than those of the SiOCN film of the first reference example, the SiOC film in the second reference example, and the SiN film in the comparative example. Based on the above, it is confirmed that the C concentration in the SiOC film can be increased by performing the $C_3H_6$ gas supplying process in a period before starting supply of the TEA gas (i.e., supply halt period), in a period of supplying the TEA gas, and in a period after ending supply of the TEA gas (i.e., supply halt period). It is also confirmed that the C concentration in the SiOC film can be finely adjusted and increased while controlling the amount of increase in the C concentration by appropriately controlling the supply conditions for the $C_3H_6$ gas supplying process (i.e., the gas supply time, the flow rate, the internal pressure of the process chamber, the partial pressure of the $C_3H_6$ gas, etc.) performed in the TEA gas supply period and/or in the TEA gas supply halt period.

Figure 10:
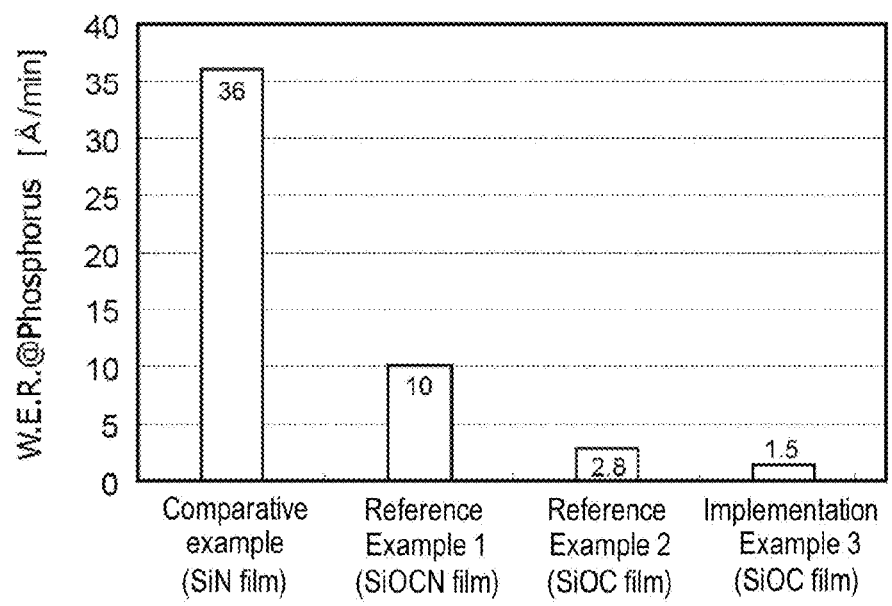
FIG. 10 illustrates measurement results on a resistance to hot phosphoric acid of the SiOC film according to the third implementation example of the present disclosure.

FIG. 10 illustrates measurement results on a resistance to hot phosphoric acid of the SiOC film according to the third implementation example. In FIG. 10, a horizontal axis represents films according to the comparative example, the first reference example, the second reference example, and the implementation example, and a vertical axis represents a wet etching rate (WER) [Å/min] when a film is etched by a hot phosphoric acid-containing solution, i.e., a resistance to hot phosphoric acid of a film. FIG. 10 shows that the WER of the SiOC film in the third implementation example is smaller than those of the SiOCN film in the first reference example, the SiOC film in the second reference example, and the SiN film in the comparative example. Thus, it is confirmed that the C concentration in the SiOC film can be increased and the resistance to hot phosphoric acid can be improved by performing the $C_3H_6$ gas supplying process in a period before starting supply of the TEA gas (i.e., supply halt period), in a period of supplying the TEA gas, and in a period after ending supply of the TEA gas (i.e., supply halt period). In addition, measurement results on the resistance to HF of the SiOC film in the third implementation example confirms that the SiOC film in the third implementation example achieves a high resistance to HF, like a resistance to hot phosphoric acid.

Figure 11:
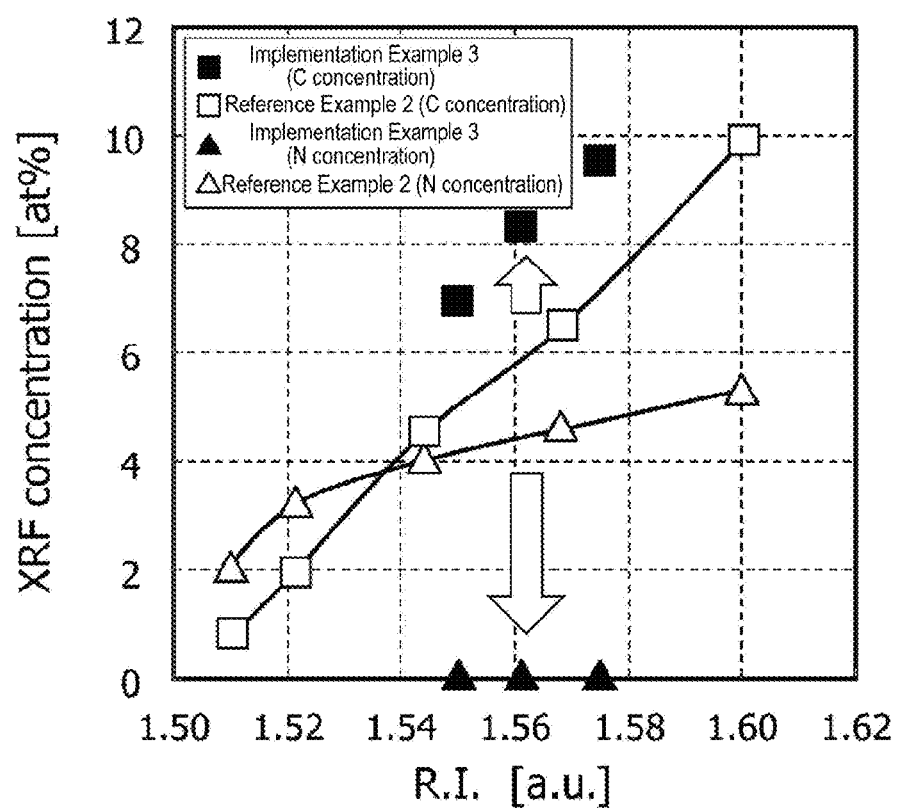
FIG. 11 illustrates results of XRF (X-Ray Fluorescence) and refractive index measurements on the SiOC film according to the third implementation example of the present disclosure.

FIG. 11 illustrates results of XRF and refractive index measurements on the SiOC film according to the third implementation example. In FIG. 11, a horizontal axis represents a refractive index (R.I.) [a.u.], and a vertical axis represents C and N concentrations [at %] in a film measured in XRF. In FIG. 11, black square symbols (■) represent the C concentration in the SiOC film of the third implementation example, white square symbols (□) represent the C concentration in the SiOC film of the second reference example, black triangle symbols (▲) represent the N concentration in the SiOC film of the third implementation example, and white triangle symbols (△) represent the N concentration in the SiOC film of the second reference example. FIG. 11 shows that for the refractive indices of the films in a same or similar level, the SiOC film of the third implementation example has a greater C concentration and a smaller N concentration than the SiOC film of the second reference example does. As such, FIG. 11 shows that for the refractive indices of the films in a same or similar level, the SiOC film of the third implementation example has a greater resistance to HF and a greater resistance to hot phosphoric acid than the SiOC film of the second reference example does.

Figure 12:
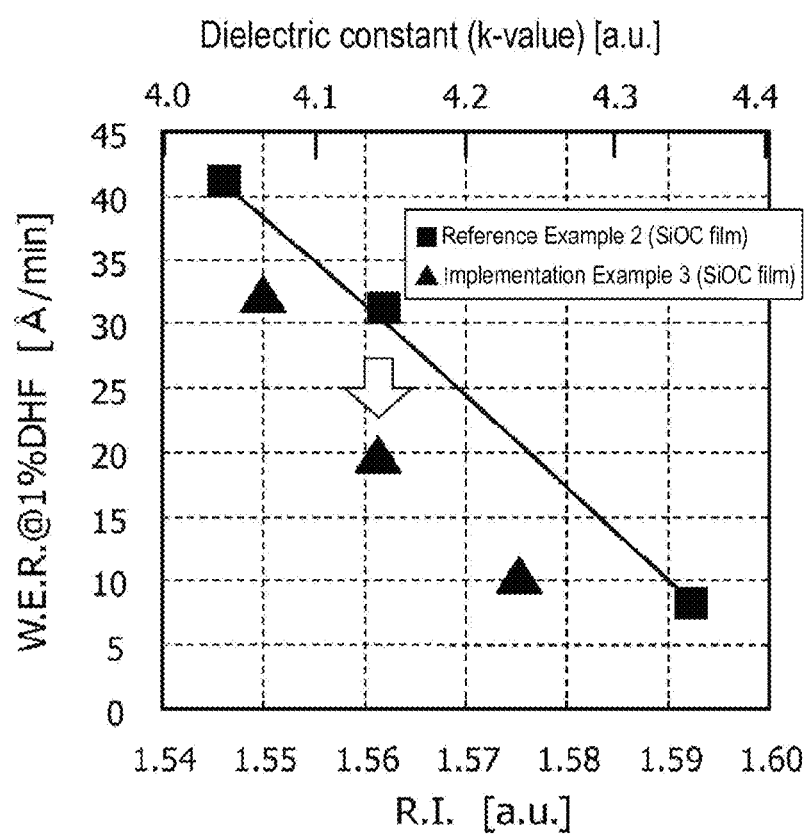
FIG. 12 illustrates measurement results on a resistance to hydrogen fluoride, a refractive index, and a relative dielectric constant of the SiOC film according to the third implementation example of the present disclosure.

FIG. 12 illustrates measurement results on a resistance to HF, a refractive index, and a dielectric constant of the SiOC film according to the third implementation example. In FIG. 12, a lower horizontal axis represents a refractive index (R.I.) [a.u.], an upper horizontal axis represents a dielectric constant (or k-value) [a.u.], and a vertical axis represents a wet etching rate (WER) [Å/min] when a film is etched by a 1% HF-containing solution, i.e., a resistance to HF of the film. FIG. 12 shows that for the refractive indices and dielectric constants of the films in same or similar levels, the WER of the SiOC film in the third implementation example is smaller than that of the SiOC film in the second reference example. As such, FIG. 12 shows that for the refractive indices and dielectric constants of the films in the same or similar levels, the resistance to HF of the SiOC film in the third implementation example is greater than that of the SiOC film in the second reference example. This matches with the measurement results shown in FIG. 11.

In addition, although in the above-described first to third implementation examples, the $C_3H_6$ gas is supplied to form the SiOC film at the gas supply timings shown in the third modified example of FIG. 5, it is confirmed that the same effects as the first to third implementation examples are achieved even when the $C_3H_6$ gas is supplied to form the SiOC film at other gas supply timings shown in FIG. 5. In addition, it is also confirmed that the same effects as the first to third implementation examples are achieved even when the $C_3H_6$ gas was supplied to form the SiOC film at different gas supply timings shown in FIGS. 13 and 14.

Aspects of Present Disclosure

Hereinafter, some aspects of the present disclosure will be additionally stated.
(Supplementary Note 1)
According to an aspect of the present disclosure, there is provided a method of manufacturing a semiconductor device, the method including forming a film containing a predetermined element and carbon on a substrate by performing a cycle by a predetermined number of times, the cycle including supplying a first process gas containing the predetermined element and a halogen element to the substrate; supplying a second process gas containing carbon and nitrogen to the substrate; supplying a third process gas containing carbon to the substrate; and supplying a fourth process gas to the substrate, the fourth process gas being different from each of the first to the third process gases.
(Supplementary Note 2)
In another aspect of the present disclosure, the cycle includes performing the act of supplying the third process gas in a period in which the second process gas is supplied.
(Supplementary Note 3)
In another aspect of the present disclosure, the cycle includes performing the act of supplying the third process gas in a period in which supply of the second process gas is stopped.
(Supplementary Note 4)
In another aspect of the present disclosure, the cycle includes performing the act of supplying the third process gas concurrently with the act of supplying the second process gas.
(Supplementary Note 5)
In another aspect of the present disclosure, the cycle includes performing the act of supplying the third process gas prior to the act of supplying the second process gas.
(Supplementary Note 6)
In another aspect of the present disclosure, the cycle includes performing the act of supplying the third process gas after ending the act of supplying the second process gas.
(Supplementary Note 7)
In another aspect of the present disclosure, the act of forming the film is performed under a state where the substrate is accommodated in a process chamber, and an internal pressure of the process chamber in the act of performing the act of supplying the third process gas in the period in which the supply of the second process gas is stopped is greater than an internal pressure of the process chamber in the act of supplying the second process gas.
(Supplementary Note 8)
In another aspect of the present disclosure, the act of forming the film is performed under a state where the substrate is accommodated in a process chamber, and an internal pressure of the process chamber in the act of performing the act of supplying the third process gas prior to the act of supplying the second process gas is greater than an internal pressure of the process chamber in the act of supplying the second process gas.
(Supplementary Note 9)
In another aspect of the present disclosure, the act of forming the film is performed under a state where the substrate is accommodated in a process chamber, and an internal pressure of the process chamber in the act of performing the act of supplying the third process gas after ending the act of supplying the second process gas is greater than an internal pressure of the process chamber in the act of supplying the second process gas.
(Supplementary Note 10)
In another aspect of the present disclosure, a carbon concentration in the film is controlled by controlling supply condition (supply time, flow rate and partial pressure of the third process gas, and the internal pressure of the process chamber) in the act of supplying the third process gas.
(Supplementary Note 11)
In another aspect of the present disclosure, the second process gas includes a gas composed of three elements of carbon, nitrogen, and hydrogen and having more carbon atoms than nitrogen atoms in its composition formula (e.g., in one molecule).
(Supplementary Note 12)
In another aspect of the present disclosure, the second process gas includes a gas having a plurality of ligands containing carbon atoms in its composition formula (e.g., in one molecule).
(Supplementary Note 13)
In another aspect of the present disclosure, the second process gas includes at least one of amine and organic hydrazine.
(Supplementary Note 14)
In another aspect of the present disclosure, the third process gas includes a hydrocarbon-based gas.
(Supplementary Note 15)
In another aspect of the present disclosure, the fourth process gas includes at least one of an oxidizing gas and a nitriding gas.
(Supplementary Note 16)
In another aspect of the present disclosure, the predetermined element includes silicon or metal and the halogen element includes chlorine or fluorine.
(Supplementary Note 17)
In another aspect of the present disclosure, the act of supplying the fourth process gas includes forming a film containing the predetermined element, oxygen, carbon, and nitrogen (i.e., an oxycarbonitride film containing the predetermined element) or a film containing the predetermined element, oxygen, and carbon (i.e., an oxycarbide film containing the predetermined element) as the film by supplying an oxidizing gas as the fourth process gas.

(Supplementary Note 18)

In another aspect of the present disclosure, the act of supplying the fourth process gas includes forming a film containing the predetermined element, carbon, and nitrogen (i.e., a carbonitride film containing the predetermined element) as the film by supplying a nitriding gas as the fourth process gas.

(Supplementary Note 19)

According to another aspect of the present disclosure, there is provided a method of manufacturing a semiconductor device, the method including forming a film containing a predetermined element, carbon, and nitrogen (i.e., a carbonitride film containing the predetermined element) on a substrate by performing a cycle a predetermined number of times, the cycle including supplying a first process gas containing the predetermined element and a halogen element to the substrate; supplying a second process gas containing carbon and nitrogen to the substrate; and supplying a third process gas containing carbon to the substrate.

(Supplementary Note 20)

According to another aspect of the present disclosure, there is provided a method of manufacturing a semiconductor device, the method including forming a film containing a predetermined element, oxygen, carbon, and nitrogen (i.e., an oxycarbonitride film containing the predetermined element) or a film containing the predetermined element, oxygen and carbon (an oxycarbide film containing the predetermined element) on a substrate by performing a cycle a predetermined number of times, the cycle including supplying a first process gas containing the predetermined element and a halogen element to the substrate; supplying a second process gas containing carbon and nitrogen to the substrate; supplying a third process gas containing carbon to the substrate; and supplying a fourth process gas (e.g., an oxidizing gas) containing oxygen to the substrate.

(Supplementary Note 21)

According to still another aspect of the present disclosure, there is provided a method of manufacturing a semiconductor device, the method including forming a film containing a predetermined element, carbon, and nitrogen (i.e., a carbonitride film containing the predetermined element) on a substrate by performing a cycle a predetermined number of times, the cycle including supplying a first process gas containing the predetermined element and a halogen element to the substrate; supplying a second process gas containing carbon and nitrogen to the substrate; supplying a third process gas containing carbon to the substrate; and supplying a fourth process gas (e.g., a nitriding gas) containing nitrogen to the substrate.

(Supplementary Note 22)

According to yet another aspect of the present disclosure, there is provided a method of processing a substrate, the method including forming a film containing a predetermined element and carbon on a substrate by performing a cycle a predetermined number of times, the cycle including supplying a first process gas containing the predetermined element and a halogen element to the substrate; supplying a second process gas containing carbon and nitrogen to the substrate; supplying a third process gas containing carbon to the substrate; and supplying a fourth process gas to the substrate, the fourth process gas being different from each of the first to the third process gases.

(Supplementary Note 23)

According to yet another aspect of the present disclosure, there is provided a substrate processing apparatus including a process chamber configured to accommodate a substrate; a first gas supply system configured to supply a first process gas containing a predetermined element and a halogen element into the process chamber; a second gas supply system configured to supply a second process gas containing carbon and nitrogen into the process chamber; a third gas supply system configured to supply a third process gas containing carbon into the process chamber; a fourth gas supply system configured to supply a fourth process gas into the process chamber, the fourth process gas being different from each of the first to the third process gases; and a control unit configured to control the first to the fourth gas supply systems to form a film containing the predetermined element and carbon on the substrate by performing a cycle a predetermined number of times, the cycle including supplying the first process gas to the substrate in the process chamber; supplying the second process gas to the substrate in the process chamber; supplying the third process gas to the substrate in the process chamber; and supplying the fourth process gas to the substrate in the process chamber.

(Supplementary Note 24)

According to yet another aspect of the present disclosure, there is provided a program that causes a computer to perform a process of manufacturing a semiconductor device, the process including forming a film containing a predetermined element and carbon on a substrate by performing a cycle by a predetermined number of times, the cycle including supplying a first process gas containing the predetermined element and a halogen element to the substrate; supplying a second process gas containing carbon and nitrogen to the substrate; supplying a third process gas containing carbon to the substrate; and supplying a fourth process gas to the substrate, the fourth process gas being different from each of the first to the third process gases.

(Supplementary Note 25)

According to yet another aspect of the present disclosure, there is provided a non-transitory computer-readable recording medium storing a program that causes a computer to perform a process of forming a film containing a predetermined element and carbon on a substrate in a process chamber by performing a cycle a predetermined number of times, the cycle including supplying a first process gas containing the predetermined element and a halogen element to the substrate in the process chamber; supplying a second process gas containing carbon and nitrogen to the substrate in the process chamber; supplying a third process gas containing carbon to the substrate in the process chamber; and supplying a fourth process gas to the substrate in the process chamber, the fourth process gas being different from each of the first to the third process gases.

According to the present disclosure in some embodiments, it is possible to provide a method of manufacturing a semiconductor device, which is capable of increasing controllability of compositions in a film in order to provide the film with properties of low dielectric constant, high etching resistance and high leak resistance.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising forming a film containing a predetermined element and carbon on a substrate in a process chamber by performing a cycle a predetermined number of times, the cycle comprising:
    supplying a first process gas containing the predetermined element and a halogen element to the substrate in the process chamber;
    supplying a second process gas containing carbon and nitrogen to the substrate in the process chamber;
    supplying a third process gas containing carbon to the substrate in the process chamber, the third process gas being different from the second process gas; and
    supplying a fourth process gas to the substrate in the process chamber, the fourth process gas being different from each of the first to the third process gases,
    wherein the cycle comprises performing the act of supplying the third process gas in a period in which the second gas is supplied.

2. A method of manufacturing a semiconductor device, the method comprising forming a film containing a predetermined element and carbon on a substrate in a process chamber by performing a cycle a predetermined number of times, the cycle comprising:
    supplying a first process gas containing the predetermined element and a halogen element to the substrate in the process chamber;
    supplying a second process gas containing carbon and nitrogen to the substrate in the process chamber;
    supplying a third process gas containing carbon to the substrate in the process chamber, the third process gas being different from the second process gas; and
    supplying a fourth process gas to the substrate in the process chamber, the fourth process gas being different from each of the first to the third process gases,
    wherein the cycle comprises performing the act of supplying the third process gas in a period in which supply of the second process gas is stopped.

3. The method of claim 1, wherein the cycle comprises performing the act of supplying the third process gas concurrently with the act of supplying the second process gas.

4. A method of manufacturing a semiconductor device, the method comprising forming a film containing a predetermined element and carbon on a substrate in a process chamber by performing a cycle a predetermined number of times, the cycle comprising:
    supplying a first process gas containing the predetermined element and a halogen element to the substrate in the process chamber;
    supplying a second process gas containing carbon and nitrogen to the substrate in the process chamber;
    supplying a third process gas containing carbon to the substrate in the process chamber, the third process gas being different from the second process gas; and
    supplying a fourth process gas to the substrate in the process chamber, the fourth process gas being different from each of the first to the third process gases,
    wherein the cycle comprises performing the act of supplying the third process gas prior to the act of supplying the second process gas.

5. A method of manufacturing a semiconductor device, the method comprising forming a film containing a predetermined element and carbon on a substrate in a process chamber by performing a cycle a predetermined number of times, the cycle comprising:
    supplying a first process gas containing the predetermined element and a halogen element to the substrate in the process chamber;
    supplying a second process gas containing carbon and nitrogen to the substrate in the process chamber;
    supplying a third process gas containing carbon to the substrate in the process chamber, the third process gas being different from the second process gas; and
    supplying a fourth process gas to the substrate in the process chamber, the fourth process gas being different from each of the first to the third process gases,
    wherein the cycle comprises performing the act of supplying the third process gas after ending the act of supplying the second process gas.

6. The method of claim 2, wherein an internal pressure of the process chamber in the act of performing the act of supplying the third process gas in the period in which the supply of the second process gas is stopped is greater than an internal pressure of the process chamber in the act of supplying the second process gas.

7. The method of claim 4, wherein an internal pressure of the process chamber in the act of performing the act of supplying the third process gas prior to the act of supplying the second process gas is greater than an internal pressure of the process chamber in the act of supplying the second process gas.

8. The method of claim 5, wherein an internal pressure of the process chamber in the act of performing the act of supplying the third process gas after ending the act of supplying the second process gas is greater than an internal pressure of the process chamber in the act of supplying the second process gas.

9. The method of claim 1, wherein a carbon concentration in the film is controlled by controlling a supply condition in the act of supplying the third process gas.

10. The method of claim 1, wherein the second process gas comprises a gas composed of three elements of carbon, nitrogen, and hydrogen and having more carbon atoms than nitrogen atoms in one molecule.

11. The method of claim 1, wherein the second process gas comprises a gas having a plurality of ligands containing carbon atoms in one molecule.

12. The method of claim 1, wherein the second process gas comprises at least one selected from a group consisting of amine and organic hydrazine.

13. The method of claim 1, wherein the third process gas comprises a hydrocarbon-based gas.

14. The method of claim 1, wherein the fourth process gas comprises at least one selected from a group consisting of an oxidizing gas and a nitriding gas.

15. The method of claim 1, wherein the predetermined element comprises silicon or metal and the halogen element comprises chlorine or fluorine.

16. The method of claim 1, wherein a film containing the predetermined element, oxygen, carbon, and nitrogen or a film containing the predetermined element, oxygen, and carbon is formed as the film by supplying an oxidizing gas as the fourth process gas.

17. The method of claim 1, wherein a film containing the predetermined element, carbon, and nitrogen is formed as the film by supplying a nitriding gas as the fourth process gas.

18. A substrate processing apparatus comprising:
    a process chamber configured to accommodate a substrate;

first gas supply system configured to supply a first process gas containing a predetermined element and a halogen element into the process chamber;

second gas supply system configured to supply a second process gas containing carbon and nitrogen into the process chamber;

a third gas supply system configured to supply a third process gas containing carbon into the process chamber, the third process gas being different from the second process gas;

fourth gas supply system configured to supply a fourth process gas into the process chamber, the fourth process gas being different from each of the first to the third process gases; and control unit configured to control the first to the fourth gas supply systems to form a film containing the predetermined element and carbon on the substrate by performing a cycle a predetermined number of times, the cycle comprising:

supplying the first process gas to the substrate in the process chamber;

supplying the second process gas to the substrate in the process chamber;

supplying the third process gas to the substrate in the process chamber; and supplying the fourth process gas to the substrate in the process chamber, wherein the cycle comprises performing the act of supplying the third process gas in a period in which the second gas is supplied.

19. A non-transitory computer-readable recording medium storing a program that causes a computer to perform a process of forming a film containing a predetermined element and carbon on a substrate in a process chamber by performing a cycle a predetermined number of times, the cycle comprising:

supplying a first process gas containing the predetermined element and a halogen element to the substrate in the process chamber;

supplying a second process gas containing carbon and nitrogen to the substrate in the process chamber;

supplying a third process gas containing carbon to the substrate in the process chamber, the third process gas being different from the second process gas; and supplying a fourth process gas to the substrate in the process chamber, the fourth process gas being different from each of the first to the third process gases, wherein the cycle comprises performing the act of supplying the third process gas in a period in which the second gas is supplied.

* * * * *